(12) United States Patent
Kim et al.

(10) Patent No.: US 9,966,274 B2
(45) Date of Patent: *May 8, 2018

(54) METHOD OF GENERATING PLASMA IN REMOTE PLASMA SOURCE AND METHOD OF FABRICATING SEMICONDUCTOR DEVICE USING THE SAME METHOD

(71) Applicant: Samsung Electronics Co., Ltd., Suwon-si, Gyeonggi-do (KR)

(72) Inventors: Gon-jun Kim, Suwon-si (KR); Sam Hyungsam Kim, Suwon-si (KR); Sangheon Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/598,016

(22) Filed: May 17, 2017

(65) Prior Publication Data

US 2017/0256415 A1    Sep. 7, 2017

Related U.S. Application Data

(63) Continuation of application No. 14/797,508, filed on Jul. 13, 2015, now Pat. No. 9,685,346.

(30) Foreign Application Priority Data

Jul. 14, 2014    (KR) .................. 10-2014-0088456

(51) Int. Cl.
*H01L 21/311* (2006.01)
*H01J 37/32* (2006.01)
(Continued)

(52) U.S. Cl.
CPC .. *H01L 21/31116* (2013.01); *H01J 37/32146* (2013.01); *H01J 37/32165* (2013.01);
(Continued)

(58) Field of Classification Search
CPC ............ H01L 21/31116; H01L 21/3065; H01J 37/32146; H01J 37/32165;
(Continued)

(56) References Cited

U.S. PATENT DOCUMENTS

| 8,580,354 | B2 | 11/2013 | Fu et al. |
| 8,668,776 | B2 | 3/2014 | Chen et al. |

(Continued)

FOREIGN PATENT DOCUMENTS

| JP | 2005-129579 | 5/2005 |
| JP | 2008-294121 | 12/2008 |

(Continued)

*Primary Examiner* — Anita K Alanko
(74) *Attorney, Agent, or Firm* — Myers Bigel, P.A.

(57) ABSTRACT

Provided are a method of generating plasma and a method of fabricating a semiconductor device including the method, which may improve selectivity in an etching process and minimize damage to layers. The method of generating plasma includes generating first plasma by supplying at least one first process gas into a first remote plasma source (RPS) and applying first energy having a first power at a first duty ratio, and generating second plasma by supplying at least one second process gas into a second RPS and applying second energy having a second power at a second duty ratio.

19 Claims, 26 Drawing Sheets

(51) Int. Cl.
  *C23C 16/455* (2006.01)
  *H01L 21/3065* (2006.01)

(52) U.S. Cl.
  CPC .. *H01J 37/32357* (2013.01); *C23C 16/45565* (2013.01); *C23C 16/45591* (2013.01); *H01J 37/32449* (2013.01); *H01L 21/3065* (2013.01)

(58) Field of Classification Search
  CPC .......... H01J 37/32357; H01J 37/32449; C23C 16/45565; C23C 16/45591
  See application file for complete search history.

(56) References Cited

U.S. PATENT DOCUMENTS

| | | |
|---|---|---|
| 9,105,581 B2 | 8/2015 | Kim |
| 9,136,094 B2 | 9/2015 | Cho |
| 9,362,130 B2 | 6/2016 | Ingle |
| 2004/0023513 A1 | 2/2004 | Aoyama |
| 2005/0279282 A1 | 12/2005 | Park |
| 2007/0066084 A1 | 3/2007 | Wajda |
| 2010/0151149 A1 | 6/2010 | Ovshinsky |
| 2012/0009803 A1 | 1/2012 | Jung et al. |
| 2012/0187844 A1 | 7/2012 | Hoffman et al. |
| 2014/0099794 A1 | 4/2014 | Ingle |
| 2014/0141621 A1 | 5/2014 | Ren |
| 2014/0227881 A1 | 8/2014 | Lubomirsky |

FOREIGN PATENT DOCUMENTS

| | | |
|---|---|---|
| KR | 10-2009-0001030 A | 1/2009 |
| KR | 10-2009-0056475 A | 6/2009 |
| KR | 10-0906377 | 7/2009 |
| KR | 10-2015-0065025 | 6/2015 |

AFER ETCHING

METHOD OF GENERATING PLASMA IN REMOTE PLASMA SOURCE AND METHOD OF FABRICATING SEMICONDUCTOR DEVICE USING THE SAME METHOD

CROSS-REFERENCE TO RELATED APPLICATION

This application is a continuation of U.S. patent application Ser. No. 14/797,508, filed on Jul. 13, 2015, which claims the benefit of Korean Patent Application No. 10-2014-0088456, filed on Jul. 14, 2014, the disclosures of which are incorporated by reference herein in their entireties.

BACKGROUND

The inventive concept relates to a method of fabricating a semiconductor device, and more particularly, to a method of generating plasma and a method of fabricating a semiconductor device using the generated plasma.

In general, to fabricate semiconductor devices, a series of processes, such as a deposition process, an etching process, and a cleaning process, may be performed. These processes may be performed using a deposition or etching apparatus including a process chamber. For example, an etching process may be performed in an etching apparatus including the corresponding process chamber. A layer to be etched during the etching process should have a high etch rate, while a layer that does not need to be etched should have a low etch rate. Also, damage to layers should be minimized during the etching process. In consideration of the above-described points, a direct plasma technique, such as a capacitive coupled plasma (CCP) technique or an inductive coupled plasma (ICP) technique, has been adopted, and there have been attempts at improving selectivity using the direct plasma technique. Here, the direct plasma technique may refer to a technique of directly generating plasma in a process chamber serving as a wafer processing space, and direct plasma may refer to plasma generated using the direct plasma technique. However, when direct plasma is used, there is a limit to improving selectivity, and layers that do not need to be etched may be damaged.

SUMMARY

The inventive concept provides a method of generating plasma and a method of fabricating a semiconductor device including the method of generating plasma, which may improve selectivity during an etching process and minimize damage to layers.

According to an aspect of the inventive concept, there is provided a method of generating plasma in at least one remote plasma source (RPS). The method includes generating a first plasma by supplying at least one first process gas into a first RPS and applying first energy having a first power at a first duty ratio, and generating a second plasma by supplying at least one second process gas into a second RPS and applying second energy having a second power at a second duty ratio.

The first energy may be applied in the form of a first electromagnetic wave (EMW) having a first frequency, and the second energy may be applied in the form of a second EMW having a second frequency. The supplying of the at least one first process gas into the first RPS and the applying of the first energy may be performed independent of the supplying of the at least one second process gas into the second RPS and the applying of the second energy.

The first power may be less than the second power, and the first frequency may be equal to or different than the second frequency.

In some embodiments, an on-off time period of the first EMW may be equal in duration to an on-off time period of the second EMW. The first duty ratio may be equal to the second duty ratio, and an on time period or section of the first EMW may be concurrent with or identical to an off time period or section of the second EMW.

In some embodiments, the on-off time period of the first EMW may be equal in duration to the on-off time period of the second EMW. The first duty ratio may be equal to the second duty ratio, and the on time period or section of the first EMW may be concurrent with or partially overlap the on time period or section of the second EMW.

The first EMW may be pulsed at a first pulse frequency during at least one on time period or section, and the first pulse frequency may be less than the first frequency of the first EMW.

The second EMW may be pulsed at a second pulse frequency during at least one on time period or section, and the second pulse frequency may be less than the second frequency of the second EMW.

In some embodiments, the on-off time period of the first EMW may be equal in duration to the on-off time period of the second EMW. The first duty ratio may be equal to the second duty ratio. Also, the on time period or section of the first EMW may be concurrent with the off time period or section of the second EMW, and the first EMW and the second EMW may be respectively pulsed in alternating on time periods or sections.

In some embodiments, the on-off time period of the first EMW may be equal in duration to the on-off time period of the second EMW. The first duty ratio may be equal to the second duty ratio, and the on time period or section of the first EMW may be concurrent with the off time period or section of the second EMW. Each of the first EMW and the second EMW may be pulsed during all on time periods or sections.

The first frequency or the second frequency may range from several hundred kilohertz (kHz) to several gigahertz (GHz), and the first pulse frequency or the second pulse frequency may range from several to several hundred kHz.

The first EMW may be turned on and off with a time interval of several to several tens of seconds, while the second EMW remains turned off, or the second EMW may be turned on and off with a time interval of several to several tens of seconds, while the first EMW remains turned off.

In some embodiments, the first EMW and the second EMW may be alternately turned on and off. A fluorine (F)-based first process gas may be supplied into the first RPS during the on time period or section of the first EMW and an oxide (O)-based second process gas may be supplied into the second RPS during the on time period or section of the second EMW.

In some embodiments, the first EMW and the second EMW may be simultaneously turned on and off. A fluorine-based first process gas may be supplied into the first RPS and an oxide-based second gas may be supplied into the second RPS during the on time sections of the first and second EMWs.

Types and amounts of a plurality of first elements contained in the first plasma may be controlled by controlling at least one of the at least one first process gas, the first power, the first frequency, and the first duty ratio. Types and amounts of a plurality of second elements contained in the second plasma may be controlled by controlling at least one of the at least one second process gas, the second power, the second frequency, and the second duty ratio.

The first elements may include at least one first radical used to etch a substrate or a material layer disposed on the substrate. The second elements may include at least one second radical used to etch the substrate or the material layer disposed on the substrate.

The first radical may include a fluorine radical, and the second radical may include a nitric oxide (NO) radical. The material layer may be any one of an oxide layer, a nitride layer, and a polysilicon (poly-Si) layer disposed on the substrate.

The method may further include generating a third plasma by supplying at least one third process gas into a third RPS and applying a third energy having a third power at a third duty ratio.

According to another aspect of the inventive concept, there is provided a method of generating plasma in an RPS. The method includes a first operation of generating a first plasma by supplying at least one first process gas into an RPS and applying an EMW having a first power, a second operation of turning off the EMW having the first power and stopping the supplying of the at least one first process gas, and a third operation of generating a second plasma by supplying at least one second process gas to the RPS and applying an EMW having a second power.

The EMW having the first power may have the same frequency as the EMW having the second power. The first power may be less than the second power. At least one of the EMW having the first power and the EMW having the second power may be pulsed.

The method may further include, after the third operation, a fourth operation of turning off the EMW having the second power and stopping the supplying of the at least one second process gas. A cycle including the first through fourth operations may be repeated several to several tens of times.

The EMW having the first power and the EMW having the second power may be pulsed during odd or even cycles or pulsed during all cycles.

According to another aspect of the inventive concept, there is provided a method of fabricating a semiconductor device. The method includes generating a first plasma by supplying at least one first process gas into a first RPS and applying a first EMW having a first power and a first frequency at a first duty ratio, generating a second plasma by supplying at least one second process gas into a second RPS and applying a second EMW having a second power and a second frequency at a second duty ratio, and supplying the first plasma and the second plasma into a process chamber. The first plasma and the second plasma are independently supplied into the process chamber.

The supplying of the at least one first process gas into the first RPS and the applying of the first EMW may be performed independent of the supplying of the at least one second process gas into the second RPS and the applying of the second EMW. The first power may be less than the second power.

An on-off time period of the first EMW may be equal in duration to an on-off time period of the second EMW. The first duty ratio may be equal to the second duty ratio. The first EMW and the second EMW may be applied in any one of a form in which an on time period or section of the first EMW is concurrent with an off time period or section of the second EMW, a form in which the on time period or section of the first EMW is concurrent with an on time period or section of the second EMW, and a form in which the on time period or section of the first EMW partially overlaps the on time period or section of the second EMW.

The first EMW may be pulsed at a first pulse frequency during at least one on time period or section, and the first pulse frequency may be less than the first frequency of the first EMW. The second EMW may be pulsed at a second pulse frequency during at least one on time period or section, and the second pulse frequency may be less than the second frequency of the second EMW.

A showerhead unit configured to supply the first plasma and the second plasma into the process chamber may be disposed in the process chamber. The showerhead unit may include a first channel fluidly connected to the first RPS and configured to supply the first plasma into the process chamber and a second channel fluidly connected to the second RPS and configured to supply the second plasma into the process chamber. The supplying of the first plasma and the supplying of the second plasma into the process chamber may include discretely supplying the first plasma and the second plasma through the first and second channels into the process chamber without mixing the first plasma and the second plasma.

The showerhead unit may include a first showerhead having a plurality of first holes corresponding to or fluidly connected to the first channel, and a second showerhead having a plurality of second holes corresponding to or fluidly connected to the second channel. The first holes may be configured to allow at least one first type of element used to process a substrate contained in the process chamber, from among a plurality of types of elements contained in the first plasma, to pass therethrough. The second holes may be configured to allow at least one second type of element used to process the substrate, from among a plurality of types of elements contained in the second plasma, to pass therethrough.

The discretely supplying of the first plasma and the second plasma through the first and second channels may include sequentially, simultaneously, or alternately supplying the first plasma and the second plasma into the process chamber.

The generating of the first plasma may include controlling types and amounts of elements contained in the first plasma by controlling at least one of the at least one first process gas, the first power, the first frequency, and the first duty ratio. The generating of the second plasma may include controlling types and amounts of elements contained in the second plasma by controlling at least one of the at least one second process gas, the second power, the second frequency, and the second duty ratio. The supplying of the first plasma and the second plasma into the process chamber may include supplying at least one first type of element used to process a substrate, from among a plurality of types of elements contained in the first plasma, through the first channel and supplying at least one second type of element used to process the substrate, from among a plurality of types of elements contained in the second plasma, through the second channel.

The at least one first process gas supplied into the first RPS may be a fluorine-based gas. The at least one second process gas supplied into the second RPS may be an oxide-based gas. The supplying of the first plasma and the second plasma into the process chamber may include supplying a fluorine radical into the process chamber through the first channel and supplying a NO radical into the process chamber through the second channel.

A substrate disposed in the process chamber or a material layer disposed on the substrate may be isotropically etched by controlling an inner temperature and pressure of the process chamber and amounts of the fluorine radical and the NO radical.

The method may further include generating ions from the first plasma and the second plasma by applying a bias voltage to the process chamber.

The method may further include generating a third plasma by supplying at least one third process gas into a third RPS and applying a third EMW having a third power and a third frequency at a third duty ratio.

According to another aspect of the inventive concept, there is provided a method of fabricating a semiconductor device. The method includes a first operation of generating a first plasma by supplying at least one first process gas to an RPS and applying an EMW having a first power, a second operation of turning off the EMW and stopping the supplying of the at least one first process gas, a third operation of generating a second plasma by supplying at least one second process gas to the RPS and applying an EMW having a second power, and supplying the first plasma and the second plasma into a process chamber. The first plasma and the second plasma are independently supplied into the process chamber.

The EMW having the first power may have the same frequency as the EMW having the second power. The first power may be less than the second power. At least one of the EMW having the first power and the EMW having the second power may be pulsed.

The method may further include, after the third operation, a fourth operation of turning off the EMW having the second power and stopping the supplying of the at least one second process gas. A cycle including the first through fourth operations may be repeated several to several tens of times. The EMW having the first power and the EMW having the second power may be pulsed during odd or even cycles or during all cycles.

According to another aspect of the inventive concept, there is provided a method of fabricating a semiconductor device. The method includes: generating a first plasma by supplying at least one first process gas into at least one remote plasma source (RPS) and applying a first electromagnetic wave (EMW) to the at least one RPS; generating a second plasma by supplying at least one second process gas into the at least one RPS and applying a second. EMW to the at least one RPS; and supplying the first plasma and the second plasma from the at least one RPS into the process chamber. The first plasma and the second plasma are independently generated in the at least one RPS.

In some embodiments, the method includes: turning off the first EMW and stopping the supplying of the at least one first process gas after generating the first plasma; and turning off the second EMW and stopping the supplying of the at least one second process gas after generating the second plasma.

In some embodiments, the at least one RPS includes a first RPS and a second RPS. Generating the first plasma may include supplying the at least one first process gas into the first RPS and applying the first EMW to the first RPS. Generating the second plasma may include supplying the at least one second process gas into the second RPS and applying the second EMW to the second RPS. Supplying the first plasma may include supplying the first plasma from the first RPS into the process chamber. Supplying the second plasma may include supplying the second plasma from the second RPS into the process chamber.

In some embodiments, the first EMW is applied during a first EMW on-off time period including a first EMW on time period during which the first EMW is turned on and a first EMW off time period during which the first EMW is turned off, and the second EMW is applied during a second EMW on-off time period including a second EMW on time period during which the second EMW is turned on and a second EMW off time period during which the second EMW is turned off. The first EMW on time period may be concurrent with the second EMW off time period. The first EMW on time period may be concurrent with or partially overlap the second EMW on time period.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
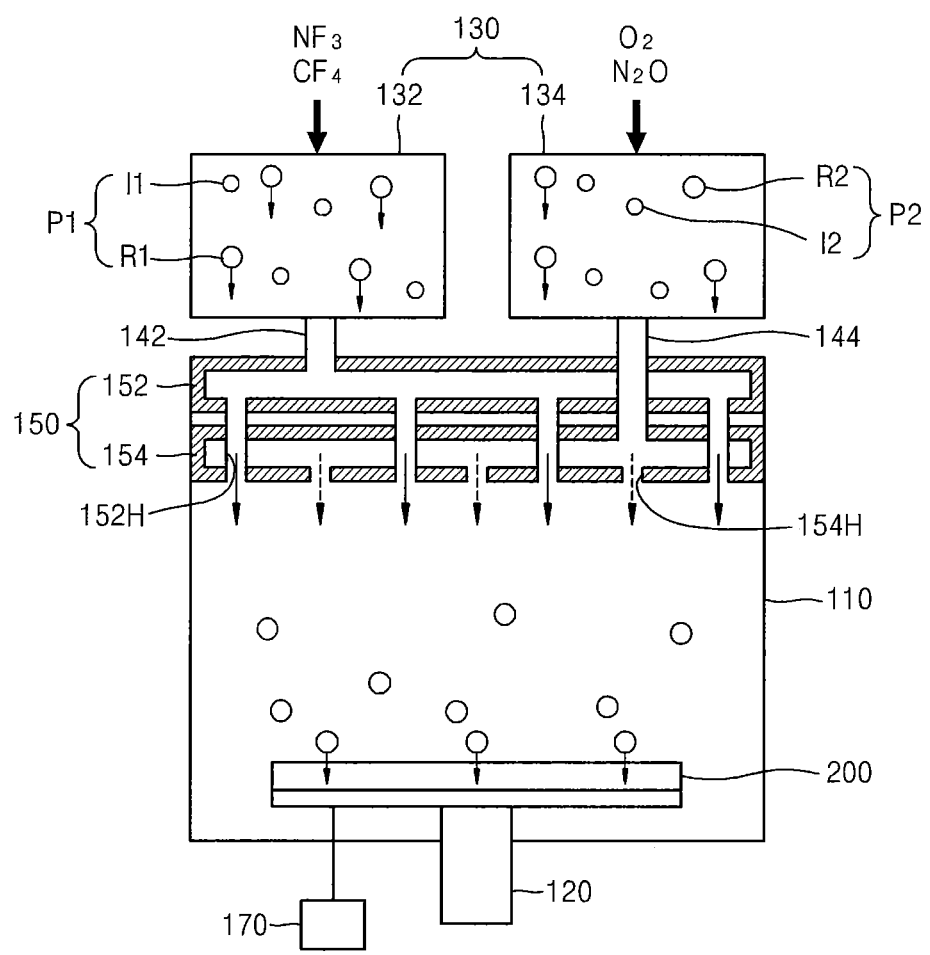
FIG. 1 is a schematic configuration diagram of a semiconductor device fabrication apparatus including a remote plasma source (RPS) according to an exemplary embodiment of the inventive concept.

The present inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

It will be understood that when an element or layer is referred to as being "on" or "connected to" another element or layer, it can be directly on or connected to the other element or layer or intervening elements or layers may be present. In the drawings, the thicknesses of layers and regions may be exaggerated for clarity. In contrast, if an element or layer is referred to as being directly on or directly connected to another element or layer, then no other intervening elements or layers are present. Descriptions of components and processing techniques that are irrelevant to the embodiments of the present inventive concept may be omitted for brevity.

It will be understood that although the terms first and second are used herein to describe various components, elements, regions, layers and/or sections, these components, elements, regions, layers and/or sections should not be limited by these terms. These terms are only used to distinguish one component, element, region, layer or section from another component, element, region, layer or section. Thus, a first component, element, region, layer or section discussed below could be termed a second component, element, region, layer or section, and similarly, a second component, element, region, layer or section could be termed a first component, element, region, layer or section without departing from the teachings of the present inventive concept. Like reference numerals refer to like elements throughout.

The terminology used herein is to describe particular embodiments only is not intended to limit the scope of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 is a schematic configuration diagram of a semiconductor device fabrication apparatus 100 including a remote plasma source (RPS) according to an exemplary embodiment of the inventive concept.

Referring to FIG. 1, the semiconductor device fabrication apparatus 100 may include a process chamber 110, a stage 120, an RPS unit 130, a showerhead unit 150, and a bias application unit 170. The process chamber 110 may be a chamber used in deposition, etching, and cleaning processes during a semiconductor device fabrication process. Thus, the semiconductor device fabrication apparatus 100 according to the present embodiment may be an apparatus configured to perform the deposition, etching, and cleaning processes during the semiconductor device fabrication process.

For example, the process chamber 110 may be a plasma etching chamber configured to etch a substrate or a material layer disposed on the substrate by using plasma. Here, the substrate may be a semiconductor substrate formed of semiconductor material. For instance, the substrate may include a Group-IV material or a Group III-V compound. Meanwhile, the substrate may be a single-crystalline wafer, such as a silicon single-crystalline wafer. However, the substrate is not limited to the single-crystalline wafer, and various wafers, such as an epi-wafer (or epitaxial wafer), a polished wafer, an annealed wafer, or a silicon-on-insulator (SOI) wafer, may be used as the substrate. Here, the epitaxial wafer may refer to a wafer on which a crystalline material is grown on a single-crystalline silicon substrate.

Meanwhile, the material layer disposed on the substrate may be an insulating layer or a conductive layer formed on the substrate by using various methods, such as a deposition process, a coating process, or a plating process. For instance, the insulating layer may be an oxide layer, a nitride layer, or an oxynitride layer, and the conductive layer may be a metal layer or a polycrystalline silicon (poly-Si) layer. Meanwhile, the material layer may be a single layer or multiple layers formed on the entire surface of the substrate. Also, the material layer may have a predetermined pattern and be formed on the substrate. Thus, in FIG. 1, an etching target 200 disposed on the stage 120 may be the substrate itself or a substrate structure including the material layer formed on the substrate.

The stage 120 may be disposed adjacent or in a bottom surface of the process chamber 110. The etching target 200 to be etched may be placed on a top surface of the stage 120. The stage 120 may support the etching target 200 during an etching process. Also, the stage 120 may function as an electrode during an etching process. For example, when a bias is applied via the bias application unit 170 during an etching process, the stage 120 may function as an electrode.

Meanwhile, in the semiconductor device fabrication apparatus 100 according to the present embodiment, as shown in FIG. 1, instead of being directly generated in the process chamber 110, plasma may be generated in the RPS unit 130 and supplied to the process chamber 110. For reference, conventional direct plasma techniques of directly generating plasma in a process chamber include a capacitive coupled plasma (CCP) technique or an inductive coupled plasma (ICP) technique. As described above, the direct plasma techniques are limited when it comes to improving selectivity, and damage may be applied to layers that do not need to be etched.

Figure 27:
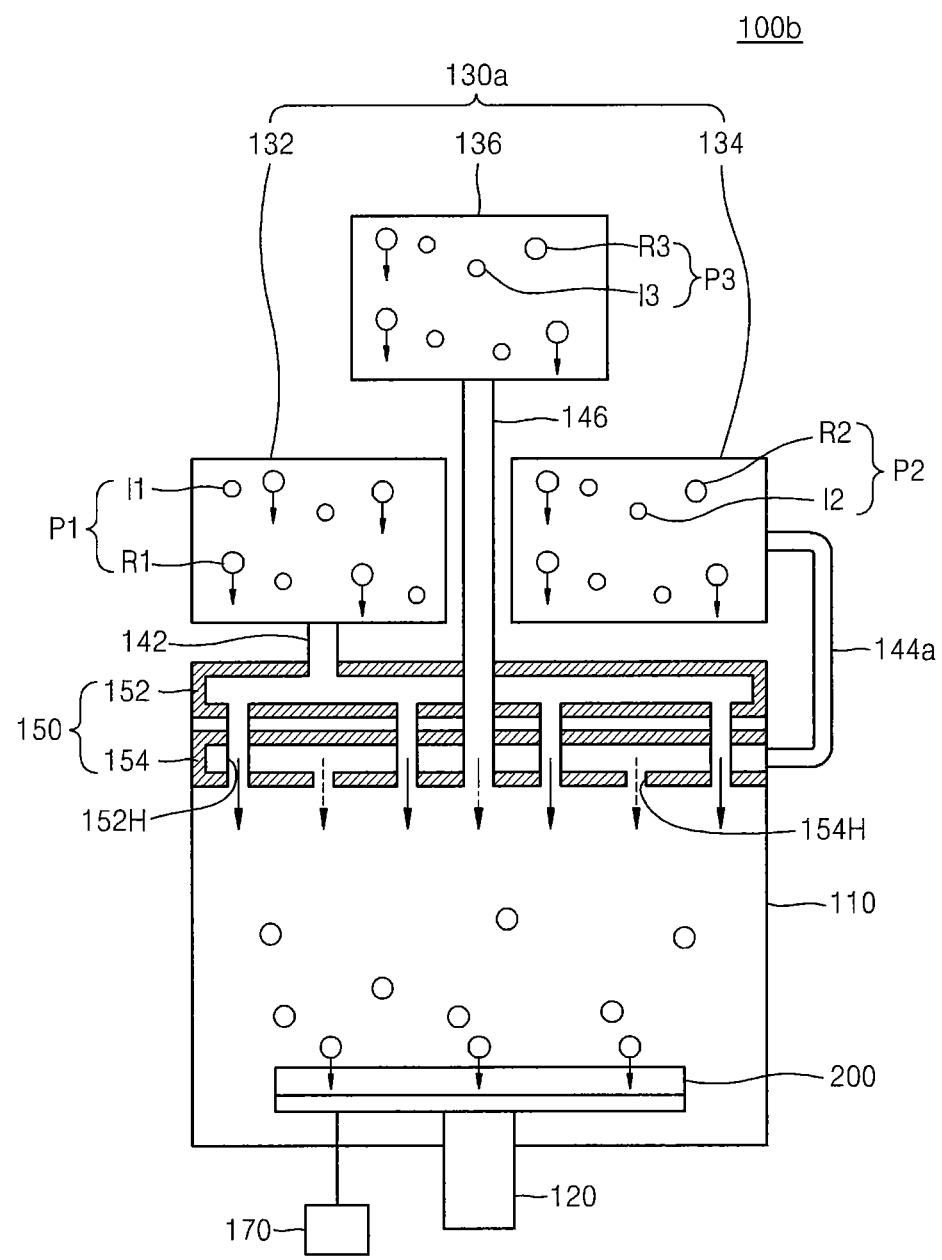
FIG. 27 is a schematic configuration diagram of a semiconductor device fabrication apparatus including three RPSs according to an exemplary embodiment of the inventive concept.

The RPS unit 130 may include a first RPS 132 and a second RPS 134. For reference, an RPS or an RPS apparatus (hereinafter, referred to collectively as an RPS) may be disposed apart from and outside the process chamber 110 in which an etching process is performed, and be a type of isolated plasma chamber configured to generate plasma separately from an etching process. Although FIG. 1 illustrates an example in which the RPS unit 130 includes two RPSs, the semiconductor device fabrication apparatus 100 according to the present embodiment is not limited thereto, and the RPS unit 130 may include three RPSs as shown in FIG. 27 or four or more RPSs. In some cases, the RPS unit 130 may include only one RPS.

As shown in FIG. 1, the first RPS 132 may be disposed outside the process chamber 110. The first RPS 132 may generate first plasma P1 from a first process gas. In the present embodiment, the semiconductor device fabrication apparatus 100 may be an etching apparatus, and the first process gas may contain at least one etch source gas. For example, the first process gas may contain a fluorine (F)-based source gas, for example, $NF_3$ or $CF_4$.

Furthermore, the first RPS 132 may generate the first plasma P1 from the first process gas under a first process condition. The first process condition may be a process condition optimized to generate the first plasma P1 for etching the substrate or the material layer disposed on the substrate from the first process gas. Accordingly, the first process condition may depend on the type of first process gas. The first process condition may include pressure, temperature, and power conditions. Meanwhile, in the semiconductor device fabrication apparatus 100 according to the present embodiment, a power application method may greatly contribute to generating and controlling plasma. For example, to generate the first plasma P1, a first electromagnetic wave (EMW) having a first frequency and a first power may be applied as a continuous wave (CW) or may be pulsed and applied during a first on-off time period. The power application method will be described in detail below with reference to FIGS. 3 through 30.

Meanwhile, the first plasma P1 may contain a plurality of elements. At least one of the plurality of elements, namely, a first element, may be mainly used to etch the substrate or the material layer disposed on the substrate. For example, the first plasma P1 may contain a first radical R1, first ions I1, electrons, and ultraviolet (UV) rays. The first radical R1 may isotropically etch the substrate or the material layer disposed on the substrate. In contrast, the first ions I1 may anisotropically etch the substrate or the material layer disposed on the substrate. Basically, radicals may be electrically neutral, while ions may have electrical polarities.

Accordingly, when the substrate or the material layer disposed on the substrate is wholly etched to a predetermined thickness (i.e., isotropically etched), the first radical R1 may be mainly used. Meanwhile, during the isotropic etching process, the first ions I1, the electrons, and the UV rays may damage the substrate or the material layer disposed on the substrate. Accordingly, in the semiconductor device fabrication apparatus 100 according to the present embodiment, the first ions I1, the electrons, and the UV rays may be removed from the first plasma P1 when supplying the first plasma P1 to the process chamber 110. In other words, when the first plasma P1 is supplied through the showerhead unit 150 to the process chamber 110, the first ions I1, the electrons, and the UV rays may be removed, and only the first radical R1 may be supplied to the process chamber 110.

As shown in FIG. 1, the second RPS 134 may also be disposed outside the process chamber 110. The second RPS 134 may generate second plasma P2 from a second process gas. The second process gas may also contain at least one etch source gas. For example, second process gas may contain oxide (O)-based source gas, such as $O_2$ or $N_2O$.

Furthermore, the second RPS 134 may generate the second plasma P2 under a second process condition different from the first process condition. The first process gas may be different from the second process gas. Naturally, a case in which the first process gas is the same as the second process gas is not completely excluded. When the first process gas and the second process gas are different, the second process condition optimized to generate the second plasma P2 for etching the substrate or the material layer disposed on the substrate from the second process gas may be different from the first process condition. The second process condition may depend on the type of second process gas. The second process condition may include pressure, temperature, and power conditions.

Meanwhile, as described above, in the semiconductor device fabrication apparatus 100 according to the present embodiment, a power application method may greatly contribute to generating and controlling plasma. For example, to generate the second plasma P2, a second EMW having a second frequency and a second power may be applied as a CW or may be pulsed and applied during a second on-off time period. Also, the second frequency, second power, and second on-off time period of the second EMW may be the same as or different from the first frequency, first power, and first on-off time period of the first EMW. For example, the second frequency and the second on-off time period may be the same as the first frequency and the first on-off time period, respectively, and the second power may be different from the first power. A power application method of the second process condition will be described in detail below with reference to FIGS. 3 through 30 along with the power application method of the first process condition.

The second plasma P2 may contain a plurality of elements. At least one of the plurality of elements, namely, a second element, may be mainly used to etch the substrate or the material layer disposed on the substrate. For example, the second plasma P2 may contain a second radical R2, second ions I2, electrons, and UV rays. Similar to the first radical R1, the second radical R2 may isotropically etch the substrate or the material layer disposed on the substrate. In contrast, the second ions I2 may anisotropically etch the substrate or the material layer disposed on the substrate.

Accordingly, in the semiconductor device fabrication apparatus 100 according to the present embodiment, when the substrate or the material layer disposed on the substrate is isotropically etched, the second radical R2 may be mainly used, and the second ions I2, the electrons, and UV rays may be removed through the showerhead unit 150 from the second plasma P2.

The showerhead unit 150 may include a first showerhead 152 and a second showerhead 154. The first showerhead 152 and the second showerhead 154 may be spaced apart from each other. However, the structure of the showerhead unit 150 is not limited to that of FIG. 1. For example, the showerhead unit 150 may have a unified structure in which two spaces are separately formed and function as a first showerhead and a second showerhead, respectively.

The first showerhead 152 may be disposed in an upper portion of an inner space of the process chamber 110. The first showerhead 152 may be fluidly connected to the first RPS 132 through a first supply pipe 142 and receive the first plasma P1 generated by the first RPS 132. Thus, the first showerhead 152 may supply the first plasma P1 generated by the first RPS 132 into the process chamber 110. For instance, the first showerhead 152 may spray the first plasma P1 through a plurality of first holes or passageways 152H toward the etching target 200 placed on the stage 120 disposed in the process chamber 110.

The plurality of first holes 152H may be formed in the first showerhead 152. The first holes 152H, which may serve as paths for connecting the inner space of the first showerhead 152 with the process chamber 110, may extend from a bottom surface of the first showerhead 152, through the second showerhead 154, and to the inside of the process chamber 110. For instance, each of the first holes 152H may have a pipe structure configured to penetrate the second showerhead 154.

Each of the first holes 152H may have such a size as to allow only the first radical R1 to pass therethrough and prevent the first ions I1 and the electrons from passing therethrough. Here, the size of each of the first holes 152H may be determined by a Debye length. Meanwhile, the first holes 152H may be connected to ground.

Accordingly, when the first plasma P1 flows through the first holes 152H, only the first radical R1 may pass through the first holes 152H and be supplied into the process chamber 110. In contrast, since the first ions I1 and the electrons cannot pass through the first holes 152H, the first ions I1 and the electrons may not be supplied into the process chamber 110. Accordingly, during an etching process, the substrate or the material layer disposed on the substrate may be prevented from being damaged due to the first ions I1 and the electrons. The size of the first holes 152H may vary according to the type of first process gas. Since the first radical R1 is sprayed through the first holes 152H into the process chamber 110, the first holes 152H may correspond to spray holes of the first showerhead 152.

The second showerhead 154 may also be disposed in the upper portion of the inner space of the process chamber 110. Also, as shown in FIG. 1, the second showerhead 154 may be disposed below the first showerhead 152. The second showerhead 154 may be fluidly connected to the second RPS 134 through a second supply pipe 144, and receive the second plasma P2 generated by the second RPS 134. Here, the second supply pipe 144 may be connected to the second showerhead 154 through the first showerhead 152. Thus, the second showerhead 154 may supply the second plasma P2 generated by the second RPS 134 into the process chamber 110. For example, the second showerhead 154 may spray the second plasma P2 generated by the second RPS 134, through a plurality of second holes or passageways 154H, toward the etching target 200 placed on the stage 120 disposed in the process chamber 110.

Like the first showerhead 152, the plurality of second holes 154H may be formed in the second showerhead 154. Each of the second holes 154H may have such a size as to allow only the second radical R2 to pass therethrough and prevent the second ions I2 and the electrons from passing therethrough. Here, the size of each of the second holes 154H may be determined by a Debye length. Meanwhile, the second holes 154H may be connected to ground.

Accordingly, when the second plasma P2 flows through the second holes 154H, only the second radical R2 may pass through the second holes 154H and be supplied into the process chamber 110. In contrast, since the second ions I2 and the electrons cannot pass through the second holes 154H, the second ions I2 and the electrons may not be supplied into the process chamber 110. Accordingly, during an etching process, the substrate or the material layer disposed on the substrate may be prevented from being damaged due to the second ions I2 and the electrons. Similarly, the size of the second holes 154H may vary according to the type of second process gas. Since the second radical R2 is sprayed through the second holes 154H into the process chamber 110, the second holes 154H may correspond to spray holes of the second showerhead 154.

Meanwhile, the pipe-type first holes 152H may penetrate the second showerhead 154, thereby forming a plurality of through holes in the second showerhead 154. Inner spaces of the first holes 152H may be isolated from the inner space of the second showerhead 154. Thus, the first radical R1 may be prevented from being mixed with the second radical R2 in the second showerhead 154 and may be directly sprayed through the first holes 152H toward the etching target 200 in the process chamber 110. The second radical R2 may be sprayed through the second holes 154H toward the etching target 200 in the process chamber 110. As described above, since the first radical R1 and the second radical R2 are not previously mixed but are discretely supplied into the process chamber 110 through separate paths, the amounts and types of the first radical R1 and the second radical R2 may be independently controlled. Thus, the etching of the substrate or the material layer disposed on the substrate may be precisely controlled.

In addition, the substrate or the material layer disposed on the substrate may be anisotropically etched. In this case, the semiconductor device fabrication apparatus 100 according to the present embodiment may further include the bias application unit 170. The bias application unit 170 may be electrically connected to the stage 120. The bias application unit 170 may apply biases to the first radical R1 and the second radical R2 sprayed from the first and second showerheads 152 and 154 and generate ions from the first radical R1 and the second radical R2. By applying the ions to the substrate or the material layer disposed on the substrate, the substrate or the material layer disposed on the substrate may be anisotropically etched.

In the semiconductor device fabrication apparatus 100 according to the present embodiment, plasmas may be independently generated using two RPSs disposed apart from the process chamber 110, and supplied into the process chamber 110. Thus, the amounts and types of the plasmas may be controlled independently and precisely in semiconductor device fabrication processes, such as deposition, etching, and cleaning processes. As a result, in the semiconductor device fabrication processes (e.g., an etching process), the etching of the substrate or the material layer disposed on the substrate may be controlled uniformly and precisely.

Figure 2:
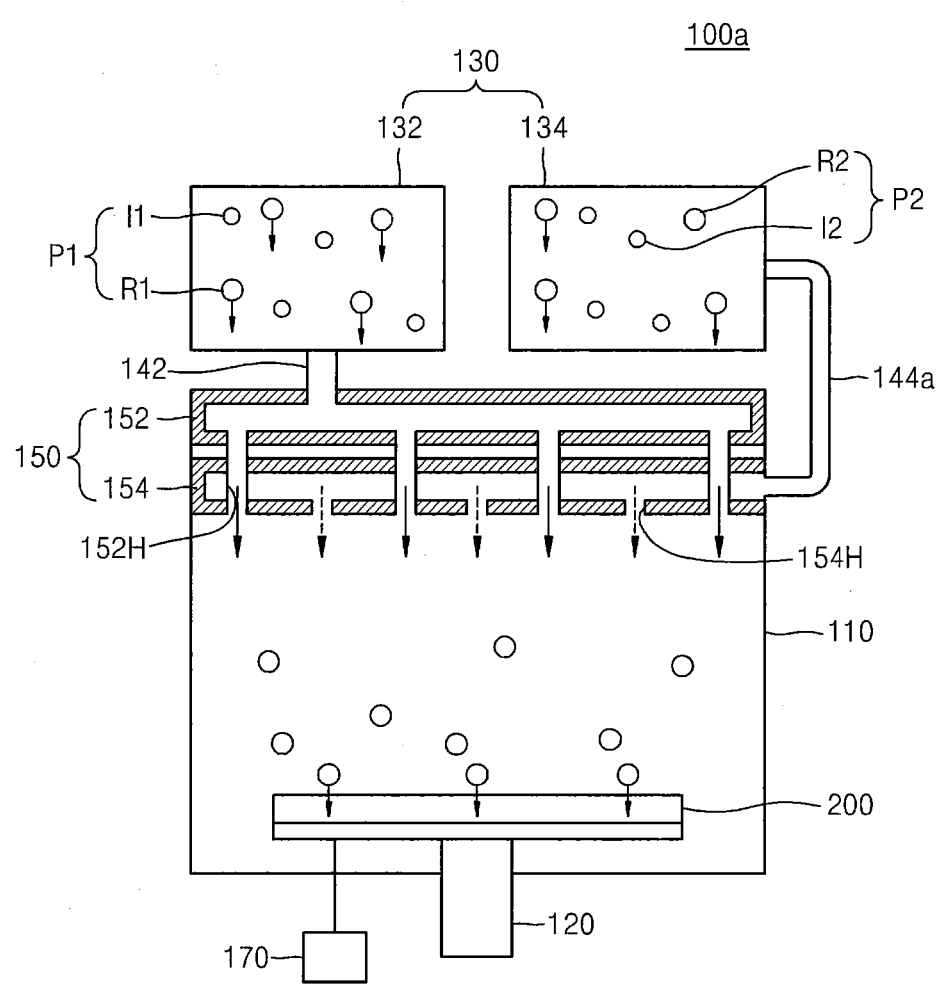
FIG. 2 is a schematic configuration diagram of a semiconductor device fabrication apparatus including an RPS according to an exemplary embodiment of the inventive concept.

FIG. 2 is a schematic configuration diagram of a semiconductor device fabrication apparatus including an RPS according to an exemplary embodiment of the inventive concept. The same descriptions as in FIG. 1 may be simplified or omitted for brevity.

Referring to FIG. 2, the semiconductor device fabrication apparatus 100a according to the present embodiment may be structurally about the same as the semiconductor device fabrication apparatus 100 of FIG. 1 except for a connection structure of a second supply pipe 144a. For example, in the semiconductor device fabrication apparatus 100 of FIG. 1, the second supply pipe 144 may extend through the first showerhead 152 and be connected to the second showerhead 154. In contrast, in the semiconductor device fabrication apparatus 100a according to the present embodiment, the second supply pipe 144a may not penetrate a first showerhead 152 but may rather be connected to a second showerhead 154 by connecting to or passing through a side surface of a process chamber 110.

A connection structure between a first supply pipe 142 and the first showerhead 152 and a connection structure between the second supply pipe 144 (or 144a) and the second showerhead 154 are not limited to those of the semiconductor device fabrication apparatuses 100 and 100a of FIGS. 1 and 2 and may be variously changed. For example, the first supply pipe 142 may be connected to the first showerhead 152 by passing through the side surface of the process chamber 110.

Figure 3:
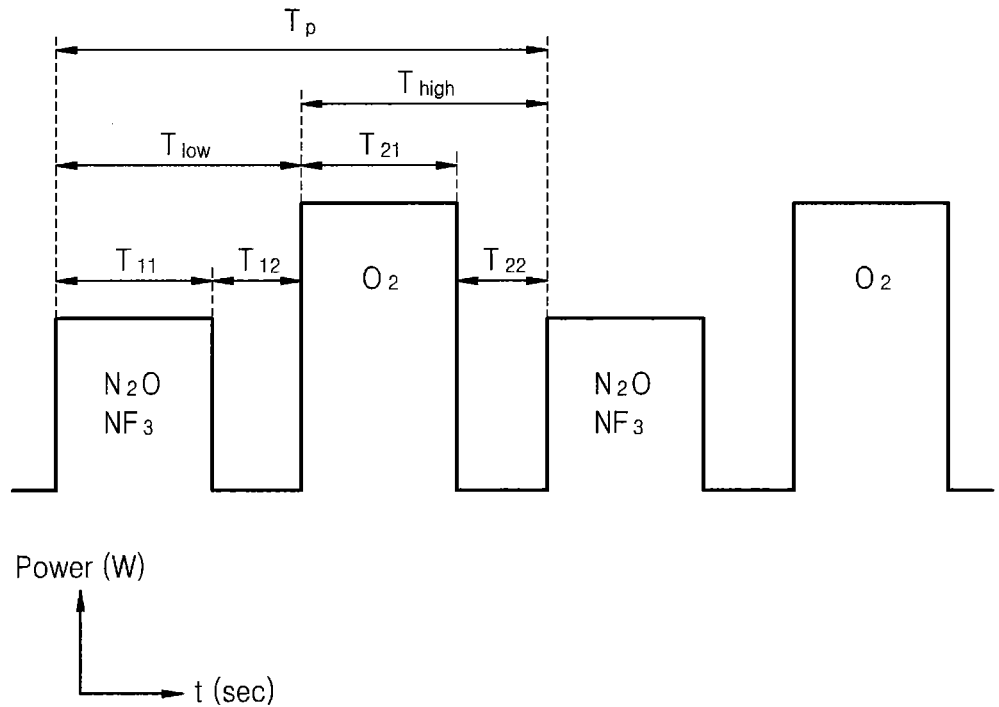
FIG. 3 is a waveform diagram of energy applied to generate plasma using one RPS according to an exemplary embodiment of the inventive concept.

FIG. 3 is a waveform diagram of energy applied to generate plasma using one RPS according to an exemplary embodiment of the inventive concept. In FIG. 3, an abscissa denotes time in seconds, and an ordinate denotes power in watts (W). The waveform diagram of FIG. 3 will be described with reference to the semiconductor device fabrication apparatus 100 of FIG. 1 in the interest of brevity.

Referring to FIG. 3, a method of generating plasma according to the present embodiment may include generating plasma in an RPS of the semiconductor device fabrication apparatus 100 of FIG. 1. Here, plasma may be generated in only one RPS, for example, the first RPS 132 or the second RPS 134. Thus, any one of the first RPS 132 and the second RPS 134 may not be used to generate plasma. Also, energy in a waveform shown in FIG. 3 may be applied to generate plasma. By supplying the energy in the waveform shown in FIG. 3, two types of plasmas may be generated.

More specifically, to generate two types of plasmas, low-power energy and high-power energy may be alternately applied. For example, when a low-power time period or section $T_{low}$ in which a low power is applied and a high-power time period or section $T_{high}$ in which a high power is applied are referred to collectively as power application time period $T_P$, energy may be repetitively applied to the RPS with a power application time period $T_P$.

The low-power time section $T_{low}$ may be divided into a first low-power time period or section $T_{11}$ in which power is applied and a second low-power time period or section $T_{12}$ in which power is not applied. During the first low-power time section $T_{11}$, energy may be applied at a predetermined power, for example, a power of less than several hundred watts. As can be seen from FIG. 4, the energy may be applied as an EMW type having a predetermined frequency. Also, a first process gas for generating first plasma may be supplied into the RPS during the first low-power time section $T_{11}$. For example, the first process gas may be a fluorine-based gas, such as $NF_3$, $CF_4$, $CHF_3$, or $CH_2F_2$. Naturally, the first process gas may contain process gases other than the fluorine-based gas. For example, the first process gas may contain $N_2$, $O_2$, $N_2O$, NO, Ar, He, or $H_2$. Meanwhile, power may not be applied during the second low-power time section $T_{12}$. In addition, the supplying of the first process gas may be stopped during the second low-power time section $T_{12}$. By preparing the second low-power time section $T_{12}$, the first plasma and second plasma, which may be generated during a subsequent high-power time section $T_{high}$, may be prevented from being degraded due to crosstalk. Thus, the second low-power time section $T_{12}$ may be referred to as a gas stabilization step.

Similarly, the high-power time section $T_{high}$ may be divided into a first high-power time period or section $T_{21}$ in which power is applied and a second high-power time period or section $T_{22}$ in which power is not applied. During the first high-power time section $T_{21}$, energy may be applied at a predetermined power of, for example, several hundred watts or more. As can be seen from FIG. 4, the energy may be applied as an EMW type having a predetermined frequency. Also, during the first high-power time section $T_{21}$, a second process gas for generating the second plasma may be supplied into the RPS. For instance, the second process gas may be an oxide-based gas, such as $O_2$, $N_2O$, or NO. Naturally, the second process gas may contain process gases other than the oxide-based gas. For example, the second process gas may contain $N_2$, Ar, He, or $H_2$. Meanwhile, power may not be applied during the second high-power time section $T_{22}$. Also, the supplying of the second process gas may be stopped during the second high-power time section $T_{22}$. By preparing the second high-power time section $T_{22}$, the second plasma and first plasma, which may be generated during a subsequent low-power time section $T_{low}$, may be prevented from being degraded due to crosstalk. Thus, the second high-power time section $T_{22}$ may also be referred to as a gas stabilization step.

Meanwhile, in some cases, process gases may be supplied during the second low-power time section $T_{12}$ and the second high-power time section $T_{22}$. For example, the second process gas may be supplied without applying power during the second low-power time section $T_{12}$, while the first process gas may be supplied without applying power during the second high-power time section $T_{22}$.

The low-power time section $T_{low}$ may have the same duration as or a different duration from the high-power time section $T_{high}$. For example, each of the low-power time section $T_{low}$ and the high-power time section $T_{high}$ may be 60 seconds. Alternatively, the low-power time section $T_{low}$ may be 60 seconds, and the high-power time section $T_{high}$ may be 80 seconds. Furthermore, during the low-power time section $T_{low}$, the first low-power time section $T_{11}$ may have the same duration as or a different duration from the second low-power time section $T_{12}$. For instance, when the low-power time section $T_{low}$ is 60 seconds, each of the first low-power time section $T_{11}$ and the second low-power time section $T_{12}$ may be 30 seconds, or the first low-power time section $T_{11}$ may be 40 seconds, and the second low-power time section $T_{12}$ may be 20 seconds. Also, during the high-power time section $T_{high}$, the first high-power time section $T_{21}$ may have the same duration as or a different duration from the second high-power time section $T_{22}$. For example, when the high-power time section $T_{high}$ is 80 seconds, each of the first high-power time section $T_{21}$ and the second high-power time section $T_{22}$ may be 40 seconds, or the first high-power time section $T_{21}$ may be 50 seconds, and the second high-power time section $T_{22}$ may be 30 seconds.

In addition, although an example in which energy is applied to the RPS during the power application time period $T_P$ is described above, the energy may be applied irrespective of the power application time period $T_P$. That is, when durations of the low-power time section $T_{low}$ and the high-power time section $T_{high}$ keep varying over multiple sequences, a definition of the power application time period $T_P$ may not be formulated. For example, each of the low-power time section $T_{low}$ and the high-power time section $T_{high}$ of a first sequence may have a duration of 10 seconds, each of the low-power time section $T_{low}$ and the high-power time section $T_{high}$ of a second sequence may have a duration of 20 seconds, and each of a third low-power time section $T_{low}$ and a third high-power time section $T_{high}$ of a third sequence may be about 15 seconds. When the durations of the respective sections keep varying as described above, periods such as the power application time period $T_P$ described above may not be defined.

Also, the semiconductor device fabrication apparatus 100 of FIG. 1 is taken as an example, and the inventive concept is not limited thereto. The above-described method of generating plasma may be embodied using a semiconductor device fabrication apparatus including only one RPS. Furthermore, the above-described method of generating plasma may be embodied using a semiconductor device fabrication apparatus including three RPSs (e.g., a semiconductor device fabrication apparatus 100b of FIG. 27) or a semiconductor device fabrication apparatus including four or more RPSs. That is, in a semiconductor device fabrication apparatus including three or more RPSs, one RPS may be used and the remaining RPSs may not be used so that energy can be applied according to the energy waveform of FIG. 3.

FIGS. 4, 5, 7, and 8 are waveform diagrams showing the application of various types of EMWs corresponding to the energy waveform diagram of FIG. 3. FIG. 6 is an enlarged view of a portion P1 of FIG. 5. In FIGS. 4 through 8, an abscissa denotes time in seconds, and an ordinate denotes power in watts (W). FIGS. 4 through 8 will be described with reference to the semiconductor device fabrication apparatus 100 of FIG. 1 in the interest of brevity.

Figure 4:
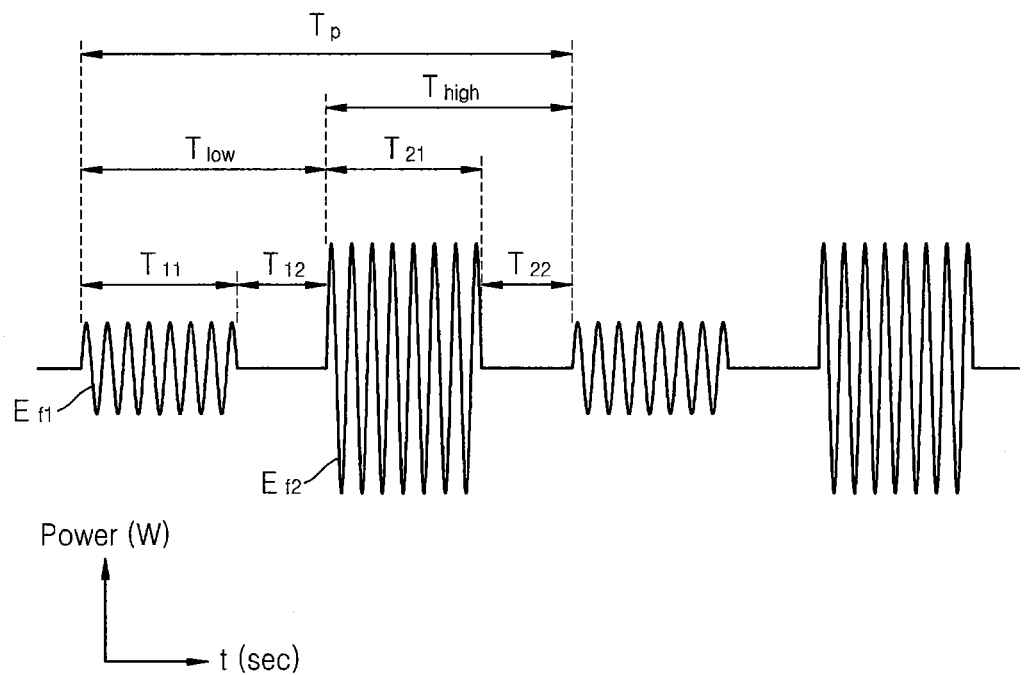
FIGS. 4, 5, 7, and 8 are waveform diagrams showing the application of various kinds of electromagnetic waves (EMWs) corresponding to the energy waveform diagram of FIG. 3.

Referring to FIG. 4, in a method of generating plasma according to the present embodiment, plasma may be generated by periodically applying an EMW having a predetermined frequency to correspond to the energy waveform diagram of FIG. 3. For reference, a frequency of an EMW for transmitting energy may be referred to as a carrier frequency, which may be a frequency corresponding to, for example, a radio frequency (RF) of several hundred kilohertz (kHz) to several megahertz (MHz) or a microwave of several gigahertz (GHz). In a specific example, the carrier frequency may be 400 kHz, a range of 60 MHz to 100 MHz, 900 MHz, or 2.45 GHz. The above-described numerical values of the carrier frequency are only examples, and various other frequencies may be adopted as the carrier frequency.

As shown in FIG. 4, according to the energy waveform of FIG. 3, the EMW may be applied at different powers during respective sections. For instance, a first EMW $E_{f1}$ may have a low power of less than several hundred watts and be applied during the first low-power time section $T_{11}$ of the low-power time section $T_{low}$. The first EMW $E_{f1}$ may have a first carrier frequency. To correspond to the energy waveform of FIG. 3, the first EMW $E_{f1}$ may not be applied during the second low-power time section $T_{12}$. Also, a second EMW $E_{f2}$ may have a high power of several hundred watts or more and be applied during the first high-power time section $T_{21}$ of the high-power time section $T_{high}$. The second EMW $E_{f2}$ may have a second carrier frequency. To correspond to the energy waveform of FIG. 3, the second EMW $E_{f2}$ may not be applied during the second high-power time section $T_{22}$. Meanwhile, the first carrier frequency of the first EMW $E_{f1}$ may be equal to or different from the second carrier frequency of the second EMW $E_{f2}$.

In the method of generating plasma according to the present embodiment, a sum of the low-power time section $T_{low}$ and the high-power time section $T_{high}$ may be set as the power application time period $T_P$, and energy may be repetitively applied using EMWs. However, as mentioned in the descriptions of FIG. 3, energy may be applied by arbitrarily repeating the low-power time section $T_{low}$ and the high-power time section $T_{high}$ irrespective of the power application time period $T_P$. Hereinafter, the same concept related to the power application time period $T_P$ may be applied to a method of generating plasma according to other exemplary embodiments. That is, although energy may be applied with a power application time period $T_P$ in some cases, energy may be applied irrespective of the power application time period $T_P$ in some other cases.

Meanwhile, in the method of generating plasma according to the present embodiment, impedance matching may be performed by varying the carrier frequency. Impedance matching may be performed by removing a reflected wave to maximize the application of power of an EMW. The impedance matching may be embodied using a method of controlling capacitance or a method of controlling a frequency. The method of generating plasma according to the present embodiment may include performing impedance matching by controlling a frequency, that is, by varying the carrier frequency. For example, when a carrier frequency of 60 MHz is used, impedance matching may be performed by varying the carrier frequency in real time in a frequency range of ±10 MHz. Hereinafter, since a concept of performing impedance matching by varying a carrier frequency may be applied to all exemplary embodiments, further descriptions of impedance matching will be omitted.

Referring to FIGS. 5 through 8, in a method of generating plasma according to the present embodiment, to generate plasma, although an EMW having a carrier frequency may be periodically applied as in FIG. 4, at least one of the first EMW $E_{f1}$ and the second EMW $E_{f2}$ may be pulsed and applied. The first EMW $E_{f1}$ and the second EMW $E_{f2}$ may be pulsed at the same pulse frequency or at respectively different pulse frequencies. For example, the first EMW $E_{f1}$ may be pulsed at a first pulse frequency $f_{p1}$, while the second EMW $E_{f2}$ may be pulsed at a second pulse frequency $f_{p2}$ different from the first pulse frequency $f_{p1}$.

In the method of generating plasma according to the present embodiment, a frequency of several to several tens or several hundred kHz may be used as the pulse frequency. Thus, one pulse period may include an EMW corresponding to several tens to several thousand periods. For instance, when the first EMW $E_{f1}$ has a carrier frequency of 100 MHz during the first low-power time section $T_{11}$ and is pulsed at a pulse frequency of 500 kHz, first EMWs $E_{f1}$ corresponding to 100 MHz/500 kHz(=200) periods may be included during one pulse time period $T_{pul}$. Meanwhile, the pulse frequency may be expressed by the reciprocal of the pulse time period $T_{pul}$, and the pulse time period $T_{pul}$ may include a pulse-on time period or section $T_{pul-on}$ and a pulse-off time period or section $T_{pul-off}$. Assuming that the pulse-on time section $T_{pul-on}$ is equal to the pulse-off time section $T_{pul-off}$, the pulse-on time section $T_{pul-on}$ may include first EMWs $E_{f1}$ corresponding to 100 periods.

Figure 5:
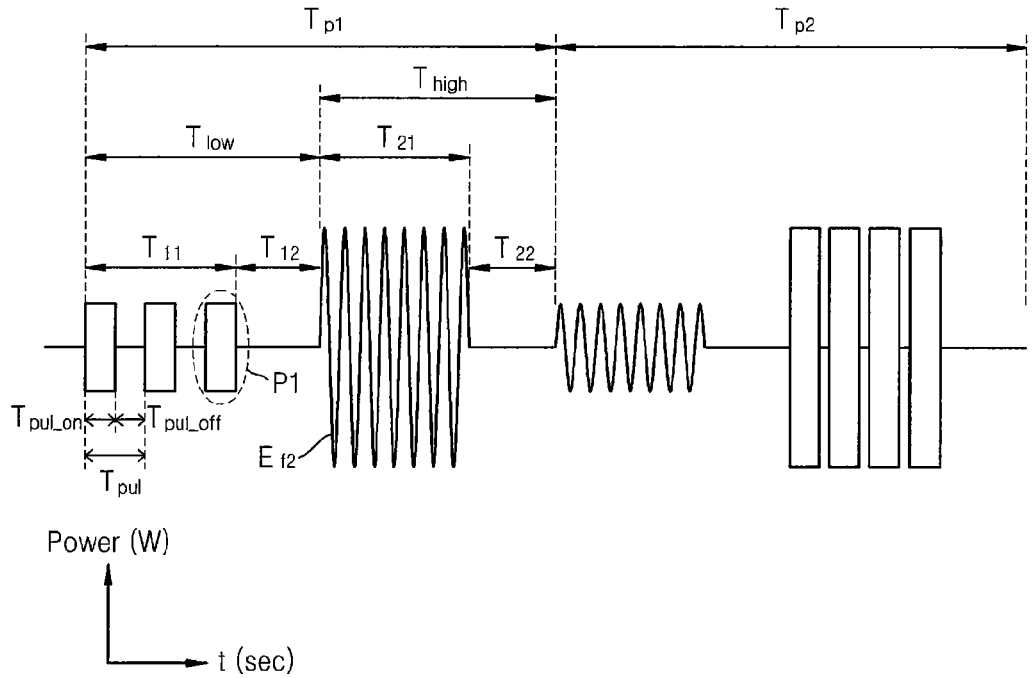
Figure 6:
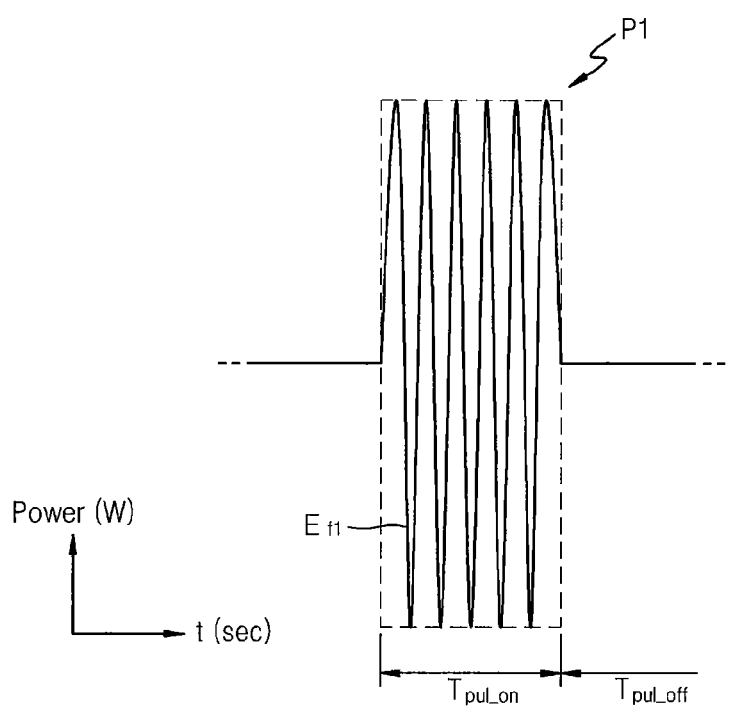
FIG. 6 is an enlarged view of a portion P1 of FIG. 5.

FIG. 6 is an enlarged view of a portion P1 of FIG. 5. FIG. 6 illustrates an example in which a first EMW $E_{f1}$ corresponding to a plurality of periods may be included during one pulse-on time section $T_{pul-on}$. Therefore, it may be inferred that when an EMW is pulsed, the EMW is repetitively applied with a pulse time period $T_{pul}$ by maintaining the EMW during the pulse-on time section $T_{pul-on}$ and turning off the EMW during the pulse-off time section $T_{pul-off}$.

Meanwhile, in FIG. 5, during the first power application time period $T_{P1}$, the first EMW $E_{f1}$ of the first low-power time section $T_{11}$ may be pulsed, while the second EMW $E_{f2}$ of the first high-power time section $T_{21}$ may not be pulsed but may be a CW. Furthermore, during the second power application time period $T_{P2}$, the first EMW $E_{f1}$ of the first low-power time section $T_{11}$ may not be pulsed but have a CW form, and the second EMW $E_{f2}$ of the first high-power time section $T_{21}$ may be pulsed. However, the pulsed form of the second EMW $E_{f2}$ is not limited to that of FIG. 5. That is, the first EMW $E_{f1}$ and the second EMW $E_{f2}$ may be pulsed in various combinations.

Figure 7:
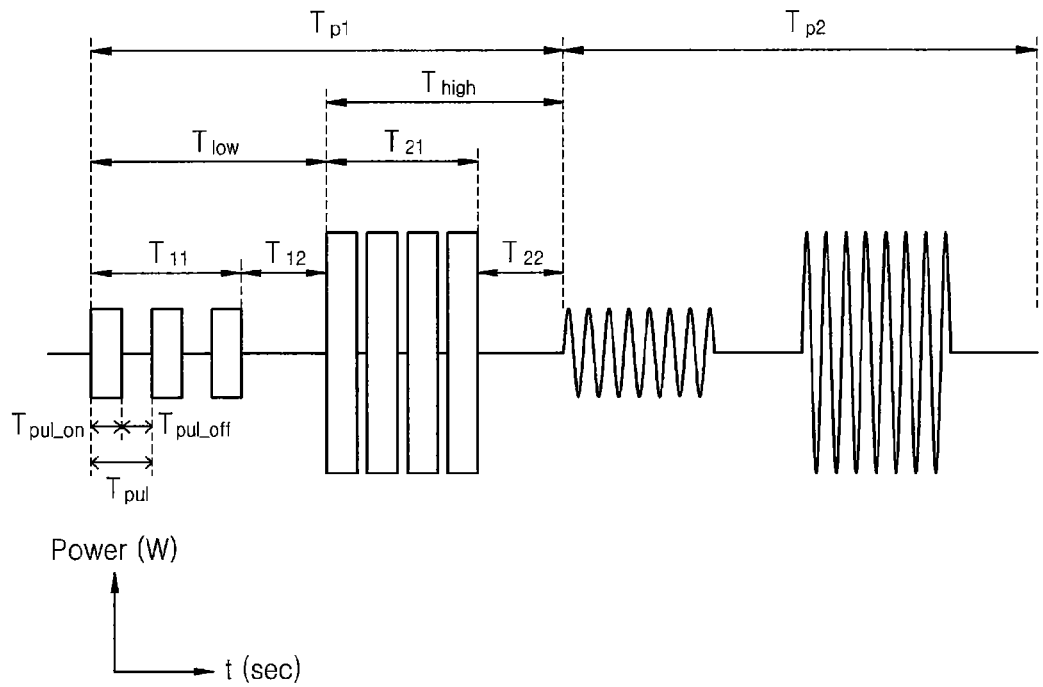

For example, as shown in FIG. 7, during the first power application time period $T_{P1}$, the first EMW $E_{f1}$ of the first low-power time section $T_{11}$ and the second EMW $E_{f2}$ of the first high-power time section $T_{21}$ may be pulsed. During the second power application time period $T_{P2}$, both the first EMW $E_{f1}$ and the second EMW $E_{f2}$ may not be pulsed but maintained as a CW form.

Figure 8:
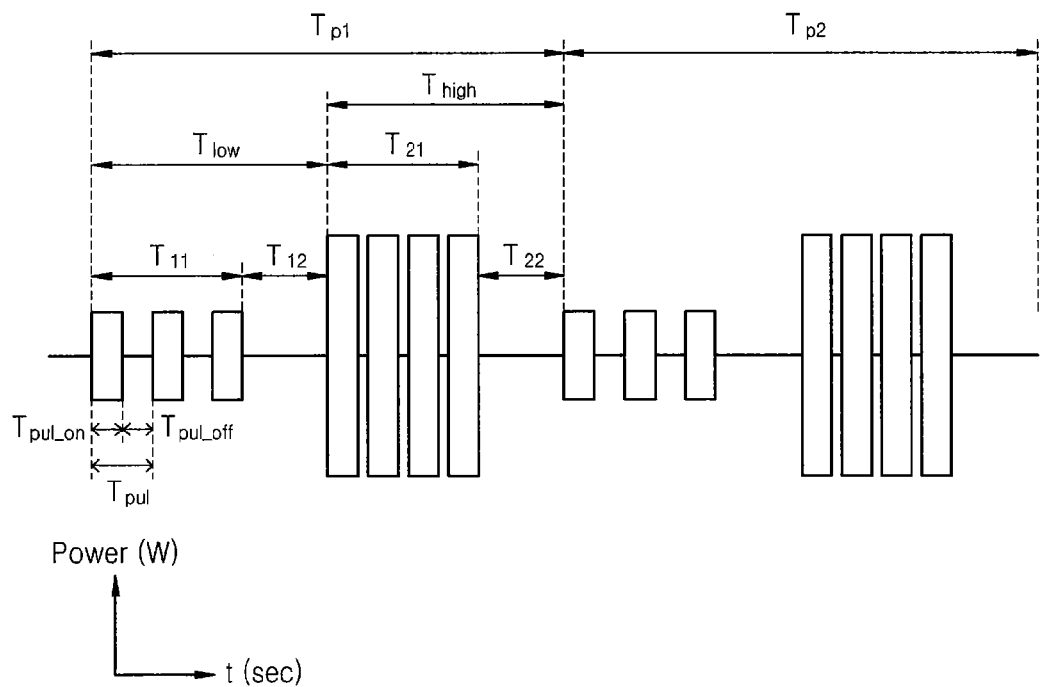

Furthermore, as shown FIG. 8, during both the first power application time period $T_{P1}$ and the second power application time period $T_{P2}$, both the first EMW $E_{f1}$ of the first low-power time section $T_{11}$ and the second EMW $E_{f2}$ of the first high-power time section $T_{21}$ may be pulsed. Meanwhile, when the first EMW $E_{f1}$ is pulsed during both the first power application time period $T_{P1}$ and second power application time period $T_{P2}$, the first EMW $E_{f1}$ of the first power application time period $T_{P1}$ and second power application time period $T_{P2}$ may be pulsed at the same pulse frequency or at different pulse frequencies.

Figure 9:
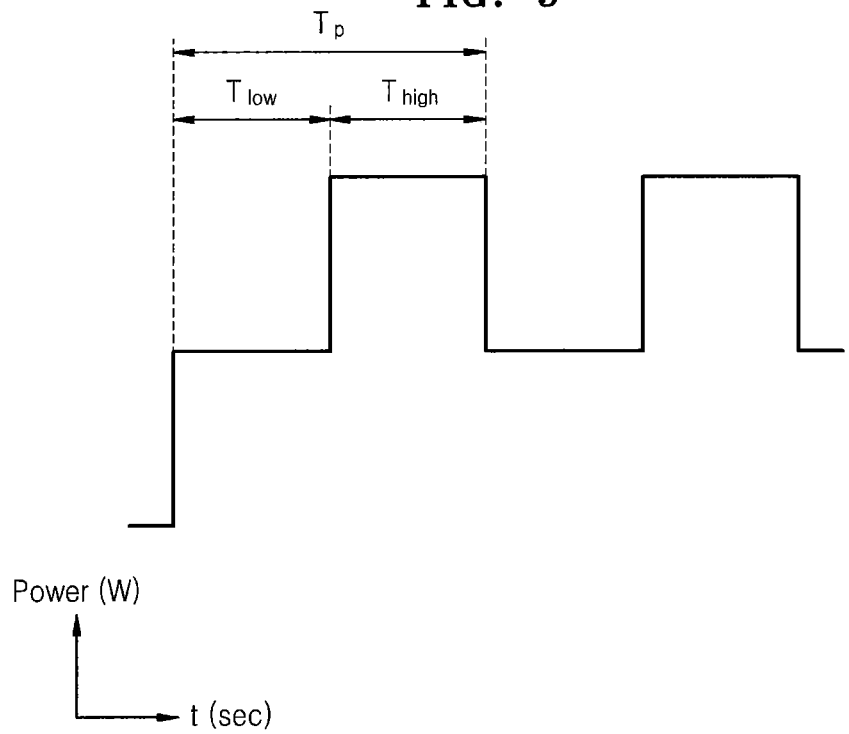
FIG. 9 is a waveform diagram of energy applied to generate plasma using one or two RPSs according to an exemplary embodiment of the inventive concept.

FIG. 9 is a waveform diagram of energy applied to generate plasma using one or two RPSs according to an exemplary embodiment of the inventive concept.

Referring to FIG. 9, in a method of generating plasma according to the present embodiment, energy may be applied without a gas stabilization step. For example, a power application time period $T_P$ may be a sum of a low-power time section $T_{low}$ and a high-power time section $T_{high}$, and the low-power time section $T_{low}$ and the high-power time section $T_{high}$ may not respectively include a second low-power time section $T_{12}$ and a second high-power time section $T_{22}$, each of which corresponds to the gas stabilization step described with reference to FIGS. 4, 5, 7, and 8.

The method of generating plasma according to the present embodiment may be applied to, for example, cases in which process gases used during the low-power time section $T_{low}$ and the high-power time section $T_{high}$ are of the same type or similar type. That is, since the process gases are of the same type or similar types, the same or similar plasmas may be generated, and degradation of the plasmas due to crosstalk may be immaterial.

Furthermore, as exemplarily shown in FIGS. 11 through 15, even if two RPSs are used, the RPSs may not affect each other so that EMWs can be applied according to the energy waveform diagram of FIG. 9 as will be described below in further detail with reference to FIGS. 11 through 15.

Figure 10:
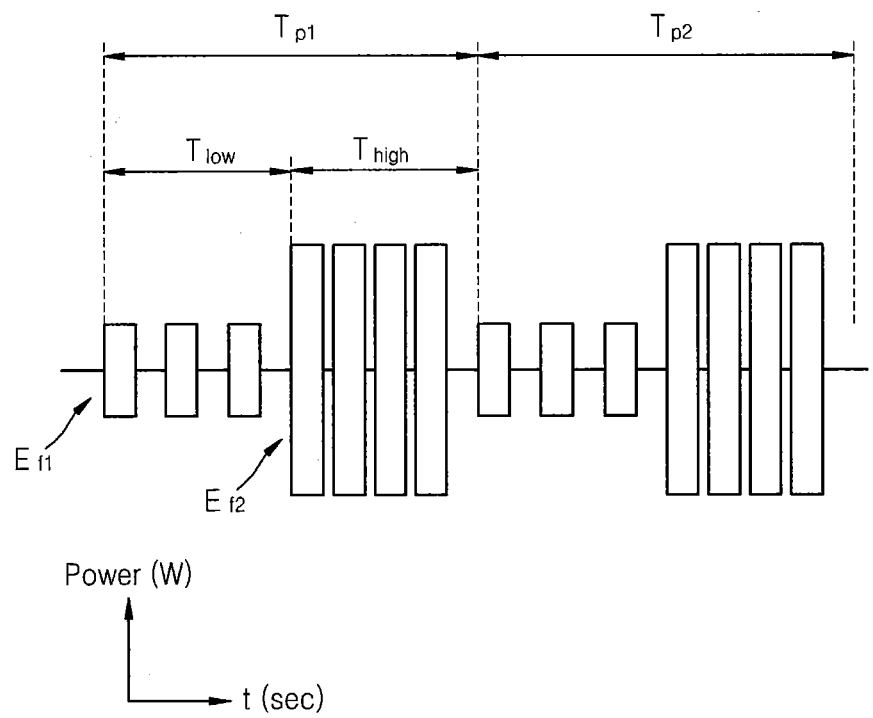
FIG. 10 is a waveform diagram showing the application of EMWs corresponding to the energy waveform diagram of FIG. 9 in a method of generating plasma using one RPS according to an exemplary embodiment of the inventive concept.

FIG. 10 is a waveform diagram showing the application of EMWs corresponding to the energy waveform diagram of FIG. 9 in a method of generating plasma using one RPS according to an exemplary embodiment of the inventive concept.

Referring to FIG. 10, in the method of generating plasma according to the present embodiment, plasma may be generated by periodically applying EMWs having predetermined carrier frequencies and corresponding to the energy waveform diagram of FIG. 9. Also, as shown in FIG. 10, the EMWs may be pulsed and applied.

More specifically, a first EMW $E_{f1}$ having a first carrier frequency and a low power may be pulsed at a first pulse frequency and applied during a low-power time period or section $T_{low}$, while a second EMW $E_{f2}$ having a second carrier frequency and a high power may be pulsed at a second pulse frequency and applied during a high-power time period or section $T_{high}$. Here, the first carrier frequency may be equal to or different from the second carrier frequency. The first pulse frequency may be equal to or different from the second pulse frequency. Meanwhile, when EMWs are shifted from the low-power time section $T_{low}$ to the high-power time section $T_{high}$ or shifted from the high-power time section $T_{high}$ to the low-power time section $T_{low}$, an EMW off time section may be present due to the pulsed EMWs. Thus, the EMW off time section may function as a gas stabilization step to some extent.

As shown in FIG. 10, EMWs may be pulsed and applied during all periods. That is, the first EMW $E_{f1}$ and the second EMW $E_{f2}$ may be pulsed and applied during both the first power application time period $T_{P1}$ and the second power application time period $T_{P2}$. However, the pulsed forms of the first EMW $E_{f1}$ and the second EMW $E_{f2}$ are not limited to those of FIG. 10. That is, the first EMW $E_{f1}$ and the second EMW $E_{f2}$ may be pulsed in various combinations. For example, similar to FIGS. 5 and 7, any one of the first EMW $E_{f1}$ and the second EMW $E_{f2}$ may be pulsed during each of power application time periods. Alternatively, both the first and second EMWs $E_{f1}$ and $E_{f2}$ may be pulsed during any one power application time period, and neither of the first and second EMWs $E_{f1}$ and $E_{f2}$ may be pulsed during the next power application time period.

FIGS. 11 through 15 are waveform diagrams showing the application of various types of EMWs corresponding to the energy waveform diagram of FIG. 9 in a method of generating plasma using two RPSs according to an exemplary embodiment of the inventive concept. In FIGS. 11 through 15, an abscissa denotes time in seconds, and an ordinate denotes power in watts (W). FIGS. 11 through 15 will be described with reference to the semiconductor device fabrication apparatus 100 of FIG. 1 in the interest of brevity.

Figure 11:
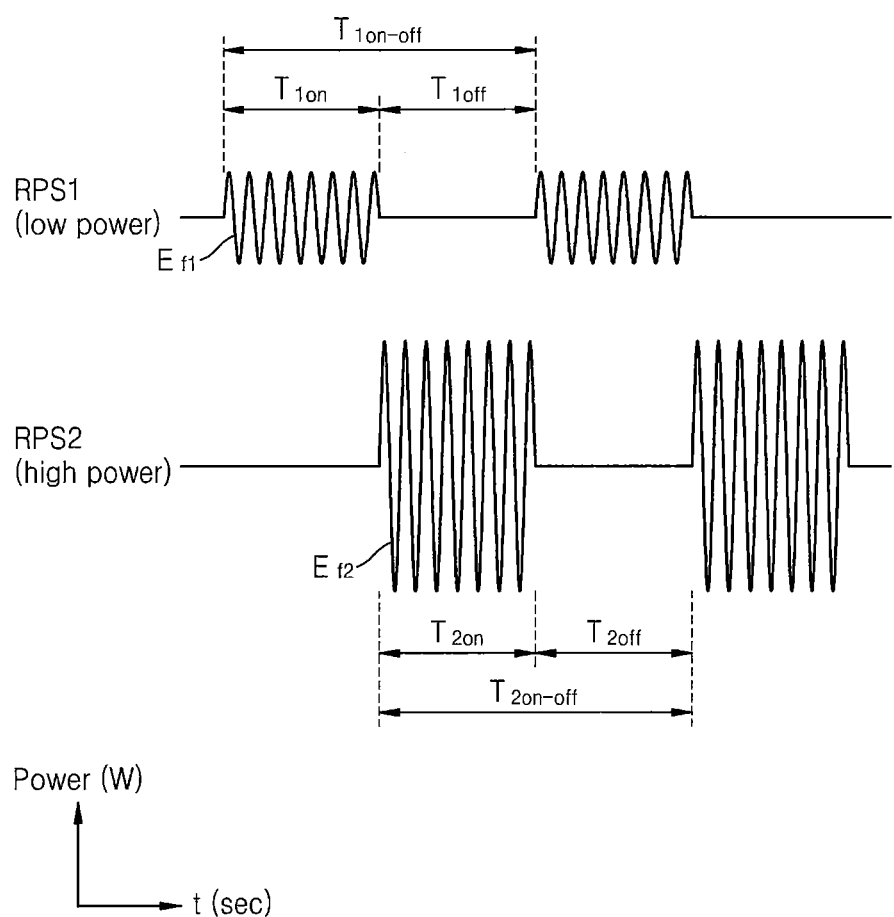
FIGS. 11 through 15 are waveform diagrams showing the application of various types of EMWs corresponding to the energy waveform diagram of FIG. 9 in a method of generating plasma using two RPSs according to an exemplary embodiment of the inventive concept.

Referring to FIG. 11, in a method of generating plasma according to the present embodiment, two RPSs may be used to generate plasma, and EMWs having different powers may be alternately applied while supplying different types of process gases to the respective RPSs, so that plasma can be generated in each of the two RPSs.

More specifically, a first EMW $E_{f1}$ having a low power and a first carrier frequency may be applied to the first RPS RPS1 (refer to 132 in FIG. 1, for example) with a first on-off time period $T_{1on-off}$. Here, the first carrier frequency may be a frequency corresponding to, for example, an RF of several hundred kHz to several MHz or a microwave of several GHz. Also, the first EMW $E_{f1}$ may have a low power of less than several hundred watts. Meanwhile, the first on-off time period $T_{1on-off}$ may include a low-power on time period or section $T_{1on}$ in which the first EMW $E_{f1}$ is applied and a low-power off time period or section $T_{1off}$ in which the first EMW $E_{f1}$ is not applied.

A first process gas, for example, a fluorine-based gas, such as $NF_3$ or $CF_4$, may be supplied to the first RPS RPS1. Naturally, in addition to the fluorine-based gas, other gases, such as $N_2$, $O_2$, $N_2O$, NO, Ar, He, or $H_2$ may be supplied to the first RPS RPS1. Meanwhile, the first process gas may be supplied during the low-power on time section $T_{1on}$ in which the first EMW $E_{f1}$ is applied. The first process gas may be supplied during the low-power off time section $T_{1off}$ in which the first EMW $E_{f1}$ is not applied. An additional gas stabilization step may not be required because only one plasma (e.g., first plasma) is generated in the first RPS RPS1 and the same first process gas is continuously supplied to the first RPS RPS1. Thus, the first EMW $E_{f1}$ having a low power may be periodically applied to the first RPS RPS1, and the first process gas may be supplied to the first RPS RPS1, so that the first plasma can be generated.

Meanwhile, a second EMW $E_{f2}$ having a high power and a second carrier frequency may be applied to the second RPS RPS2 (refer to 134 in FIG. 1, for example) with a second on-off time period $T_{2on-off}$. Here, the second carrier frequency may be a frequency corresponding to, for example, an RF of several hundred kHz to several MHz or a microwave of several GHz. The second carrier frequency may be equal to or different from the first carrier frequency of the first EMW $E_{f1}$. Also, the second EMW $E_{f2}$ may have a high power of several hundred watts or more. Meanwhile, the second on-off time period $T_{2on\text{-}off}$ may include a high-power on time period or section $T_{2on}$ in which the second EMW $E_{f2}$ is applied and a high-power off time period or section $T_{2off}$ in which the second EMW $E_{f2}$ is not applied.

As shown in FIG. 11, respective time intervals of the first on-off time period $T_{1on\text{-}off}$ and the second on-off time period $T_{2on\text{-}off}$ may be equal to each other. However, the low-power on time section $T_{1on}$ and the high-power on time section $T_{2on}$ may alternate. For example, during the low-power time section $T_{1on}$ in which the first EMW $E_{f1}$ is applied to the first RPS RPS1, the second EMW $E_{f2}$ may not be applied to the second RPS RPS2. Also, during the high-power on time section $T_{2on}$ in which the second EMW $E_{f2}$ is applied to the second RPS RPS2, the first EMW $E_{f1}$ may not be applied to the first RPS RPS1. That is, the high-power off time section $T_{2off}$ may correspond to the low-power on time section $T_{1on}$, and the high-power on time section $T_{2on}$ may correspond to the low-power off time section $T_{1off}$. Put another way, the high-power off time period $T_{2off}$ and the low-power on time period $T_{1on}$ may be concurrent, and the high-power on time period $T_{2on}$ and the low-power off time period $T_{1off}$ may be concurrent.

Meanwhile, a time interval of the first on-off time period $T_{1on\text{-}off}$ may not be equal to a time interval of the second on-off time period $T_{2on\text{-}off}$. In this case, the low-power on time period or section $T_{1on}$ and the low-power off time period or section $T_{1off}$ may overlap the high-power on time period or section $T_{2on}$ and the high-power off time period or section $T_{2off}$ in various forms.

A second process gas, for example, an oxide-based gas, such as $O_2$ or $N_2O$, may be supplied into the second RPS RPS2. Naturally, in addition to the oxide-based gas, other gases, such as $N_2$, Ar, He, or $H_2$, may be supplied to the second RPS RPS2. Meanwhile, the second process gas may be supplied during the high-power on time section $T_{2on}$ in which the second EMW $E_{f2}$ is applied. The second process gas may be supplied during the high-power off time section $T_{2off}$ in which the second EMW $E_{f2}$ is not applied, because an additional gas stabilization step is not required as described above in connection with the first process gas. Thus, the second EMW $E_{f2}$ having a high power may be periodically applied to the second RPS RPS2, and the second process gas may be supplied to the second RPS RPS2, so that second plasma can be generated.

In the method of generating plasma according to the present embodiment, two RPSs may be used, and different types of process gases may be supplied to the respective RPSs, and EMWs having different powers may be applied to the respective RPSs so that required plasmas can be generated in the two RPSs, respectively. Also, since the two RPSs are separated from each other, process gases are independently supplied, and EMWs having respective powers are respectively applied, high-quality plasmas may be generated, and the generation of the plasmas may be easily controlled. As a result, it can be inferred that the types and amounts of radicals contained in the plasmas may be controlled independently and precisely. Accordingly, due to the method of generating plasma according to the present embodiment, the type and amount of each radical may be controlled independently and precisely as required so that selectivity can be optimized during the etching of the substrate or the material layer disposed on the substrate.

Figure 12:
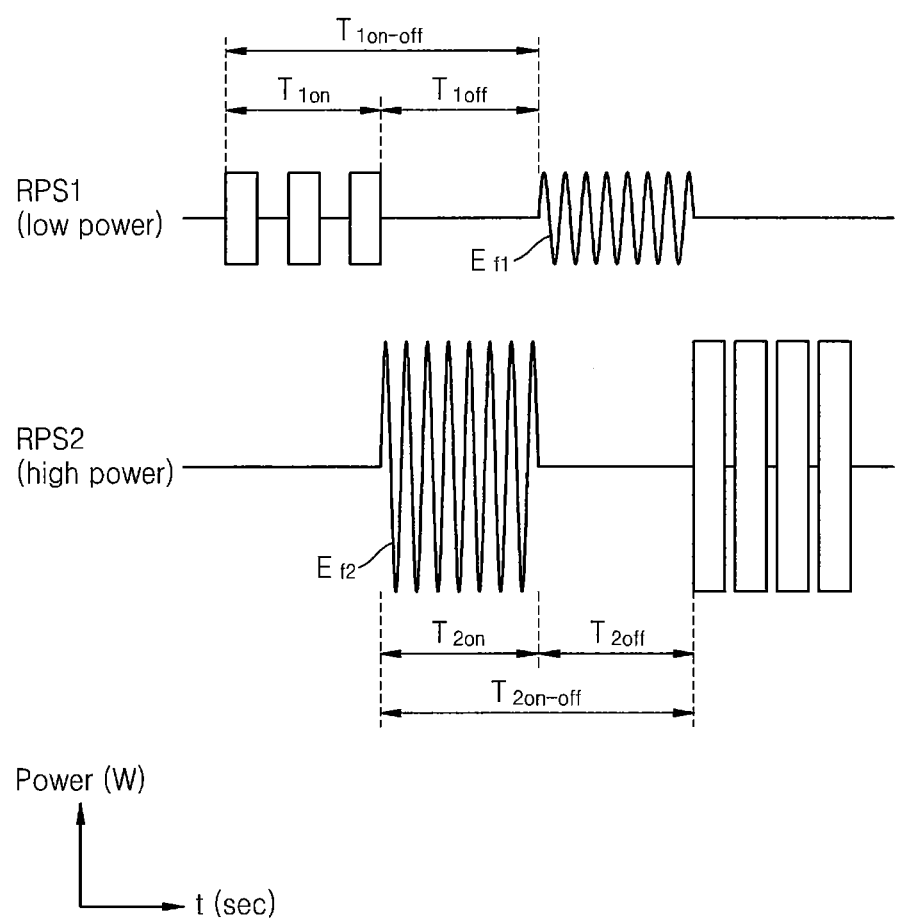

Referring to FIG. 12, in a method of generating plasma according to the present embodiment, while a first EMW $E_{f1}$ is periodically applied to the first RPS RPS1, the first EMW $E_{f1}$ may be pulsed and applied during at least one period portion. Similarly, while the second EMW $E_{f2}$ is periodically applied to the second RPS RPS2, the second EMW $E_{f2}$ may be pulsed and applied during at least one period portion.

For example, a first EMW $E_{f1}$ having a low power and a first carrier frequency may be applied to the first RPS RPS1 during a first on-off time period $T_{1on\text{-}off}$. Also, the first EMW $E_{f1}$ may be pulsed at a first pulse frequency $f_{p1}$ during the low-power on time section $T_{1on}$ of the first on-off time period $T_{1on\text{-}off}$ of a first period. Although pulsed portions are illustrated as square boxes in FIG. 12, each of the square boxes may include the first EMW $E_{f1}$ corresponding to a plurality of periods as shown in FIG. 6. The first EMW $E_{f1}$ may not be pulsed during the low-power on time section $T_{1on}$ of the first on-off time period $T_{1on\text{-}off}$ of a second period. Accordingly, the first EMW $E_{f1}$ may be alternately pulsed and applied to the first RPS RPS1.

Meanwhile, a second EMW $E_{f2}$ having a high power and a second carrier frequency may be applied to the second RPS RPS2 during a second on-off time period $T_{2on\text{-}off}$. Also, the second EMW $E_{f2}$ may not be pulsed but applied as a CW during the high-power on time section $T_{2on}$ of a second on-off time period $T_{2on\text{-}off}$ of a first period, while the second EMW $E_{f2}$ may be pulsed at a second pulse frequency $f_{p2}$ during the high-power on time section $T_{2on}$ of a second on-off time period $T_{2on\text{-}off}$ of a second period. Accordingly, the second EMW $E_{f2}$ may also be alternately pulsed and applied to the second RPS RPS2.

Meanwhile, respective time intervals of the first on-off time period $T_{1on\text{-}off}$ and the second on-off time period $T_{2on\text{-}off}$ may be equal to each other. Also, as in FIG. 11, the low-power on time section $T_{1on}$ may correspond to the high-power off time section $T_{2off}$, and the low-power off time section $T_{1off}$ may correspond to the high-power on time section $T_{2on}$. Put another way, the low-power on time period $T_{1on}$ and the high-power off time period $T_{2off}$ may be concurrent, and the low-power off time period $T_{1off}$ and the high-power on time period $T_{2on}$ may be concurrent. Thus, the second EMW $E_{f2}$ may not be applied to the second RPS RPS2 during the low-power on time section $T_{1on}$ in which the first EMW $E_{f1}$ is applied to the first RPS RPS1, and the first EMW $E_{f1}$ may not be applied to the first RPS RPS1 during the high-power on time section $T_{2on}$ in which the second EMW $E_{f2}$ is applied to the second RPS RPS2.

Furthermore, a pulsed first EMW $E_{f1}$ may be applied to the first RPS RPS1, a CW form second EMW $E_{f2}$ may be then applied to the second RPS RPS2, a CW form first EMW $E_{f1}$ may be applied to the first RPS RPS1, and a pulsed second EMW $E_{f2}$ may be then applied to the second RPS RPS2. In the above-described order, the first EMW $E_{f1}$ and the second EMW $E_{f2}$ may be applied to the corresponding first RPS RPS1 and second RPS RPS2. Naturally, the pulsed types and application order of the first EMW $E_{f1}$ and second EMW $E_{f2}$ are not limited to those of FIG. 12.

Figure 13:
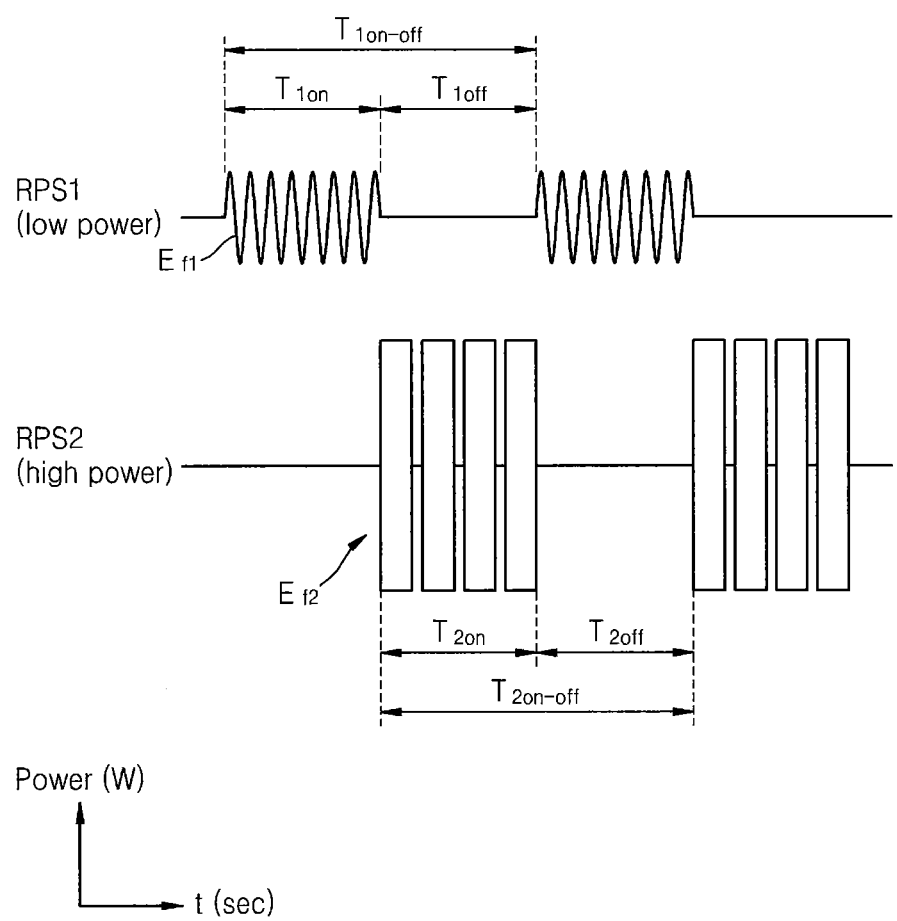

Referring to FIG. 13, in a method of generating plasma according to the present embodiment, all of the first EMWs $E_{f1}$ periodically applied to the first RPS RPS1 may be applied as a CW. Also, all of the second EMWs $E_{f2}$ periodically applied to the second RPS RPS2 may be pulsed and applied. The method of generating plasma may be the same as the method described with reference to FIG. 11 except that all the second EMWs $E_{f2}$ are pulsed. For example, the first on-off time period $T_{1on\text{-}off}$ and the second on-off time period $T_{2on\text{-}off}$ may have the same time interval. Also, the low-power on time section $T_{1on}$ may correspond to the high-power off time section $T_{2off}$, and the low-power off time section $T_{1off}$ may correspond to the high-power on time section $T_{2on}$. Put another way, the low-power on time period $T_{1on}$ and the high-power off time period $T_{2off}$ may be concurrent, and the low-power off time period $T_{1off}$ and the high-power on time period $T_{2on}$ may be concurrent.

Figure 14:
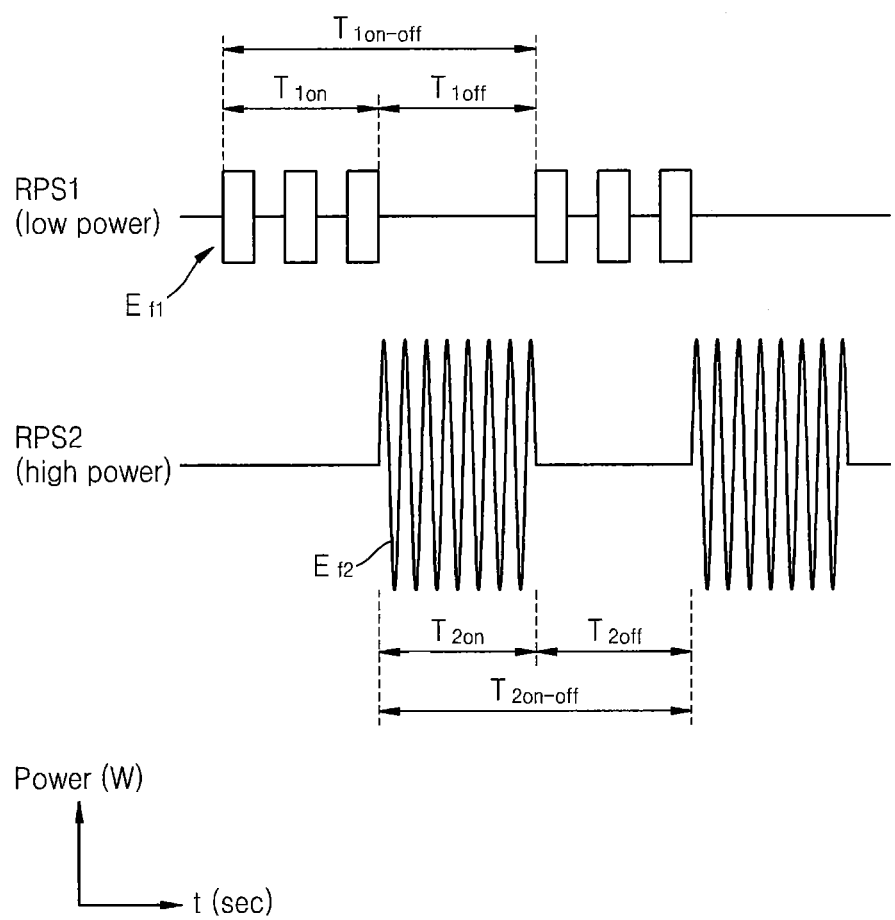

Referring to FIG. 14, a method of generating plasma according to the present embodiment may be conceptionally opposite the method of generating plasma described with reference to FIG. 13. For instance, all of the first EMWs $E_{f1}$ periodically applied to the first RPS RPS1 may be pulsed and applied. Also, all of the second EMWs $E_{f2}$ periodically applied to the second RPS RPS2 may be applied as a CW type. The method of generating plasma may be the same as the method of generating plasma described with reference to FIG. 11 except that all of the first EMWs $E_{f1}$ are pulsed.

Figure 15:
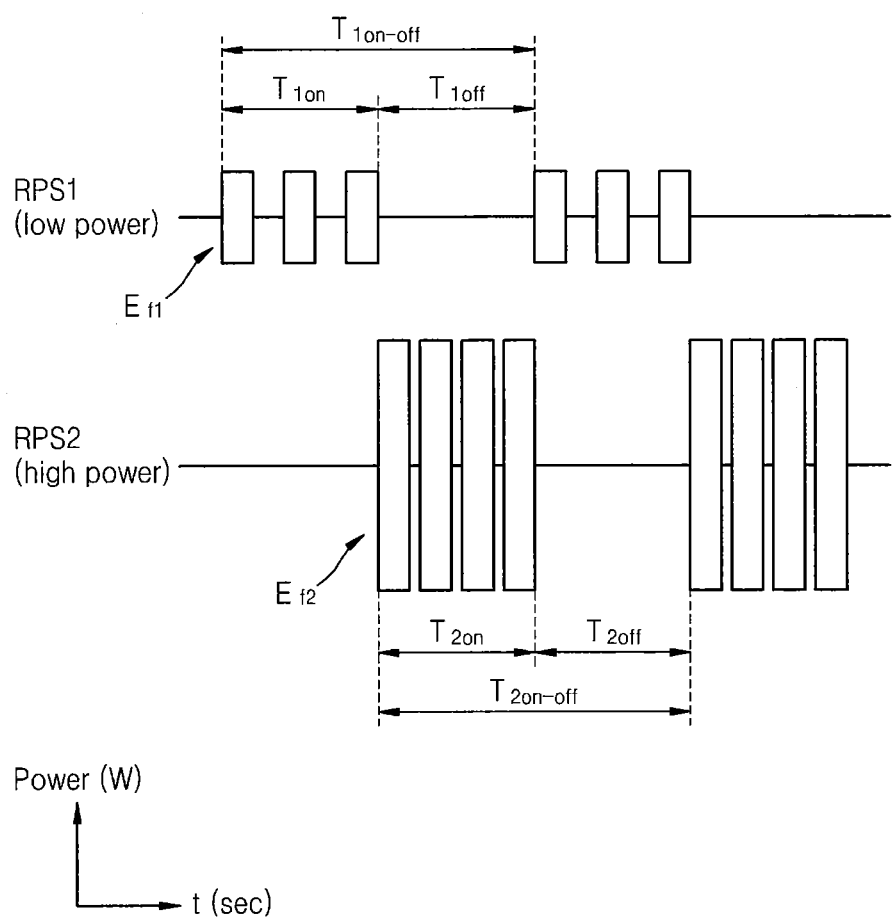

Referring to FIG. 15, in a method of generating plasma according to the present embodiment, while first EMWs $E_{f1}$ are periodically applied to the first RPS RPS1, all of the first EMWs $E_{f1}$ may be pulsed and applied. Also, while second EMWs $E_{f2}$ are periodically applied to the second RPS RPS2, all of the second EMWs $E_{f2}$ may be pulsed and applied. The method of generating plasma may be the same as the method of generating plasma described with reference to FIG. 11 except that all of the first EMWs $E_{f1}$ and all of the second EMW $E_{f2}$ are pulsed. For instance, the first on-off time period $T_{1on-off}$ and the second on-off time period $T_{2on-off}$ may have the same time interval. Also, the low-power on time section $T_{1on}$ may correspond to the high-power off time section $T_{2off}$, and the low-power off time section $T_{1off}$ may correspond to the high-power on time section $T_{2on}$. Put another way, the low-power on time period $T_{1on}$ and the high-power off time period $T_{2off}$ may be concurrent, and the low-power off time period $T_{1off}$ and the high-power on time period $T_{2on}$ may be concurrent.

Figure 16:
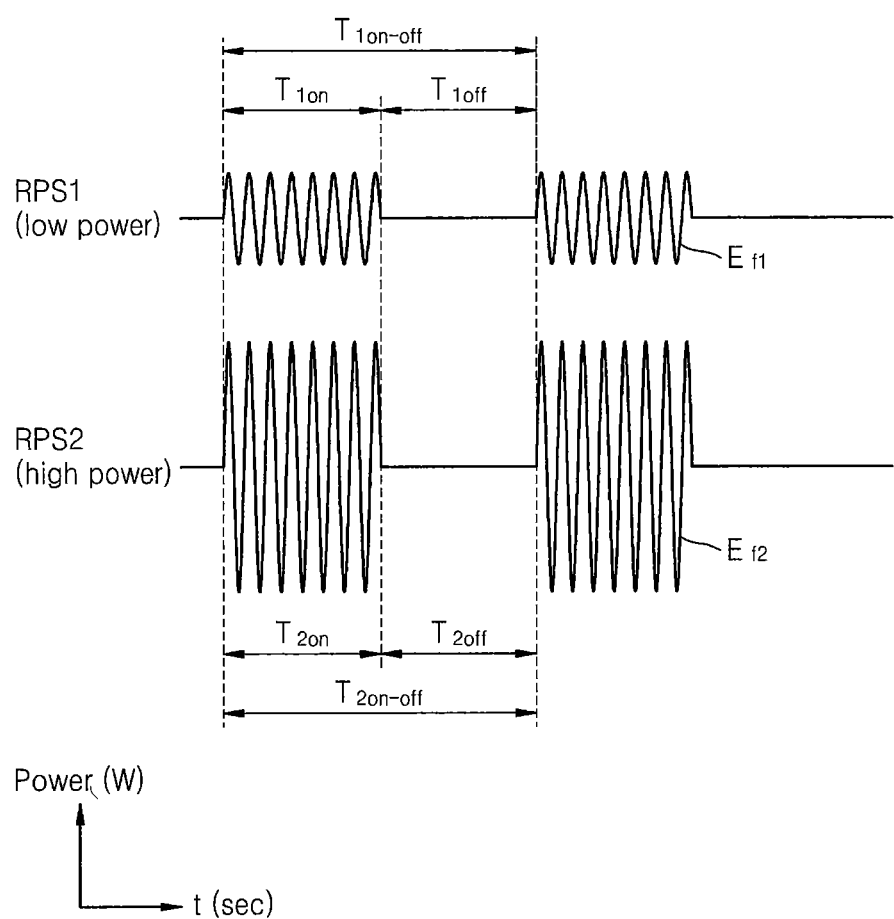
FIGS. 16 through 18 are waveform diagrams showing the application of EMWs in a method of generating plasma using two RPSs according to an exemplary embodiment of the inventive concept.
Figure 17:
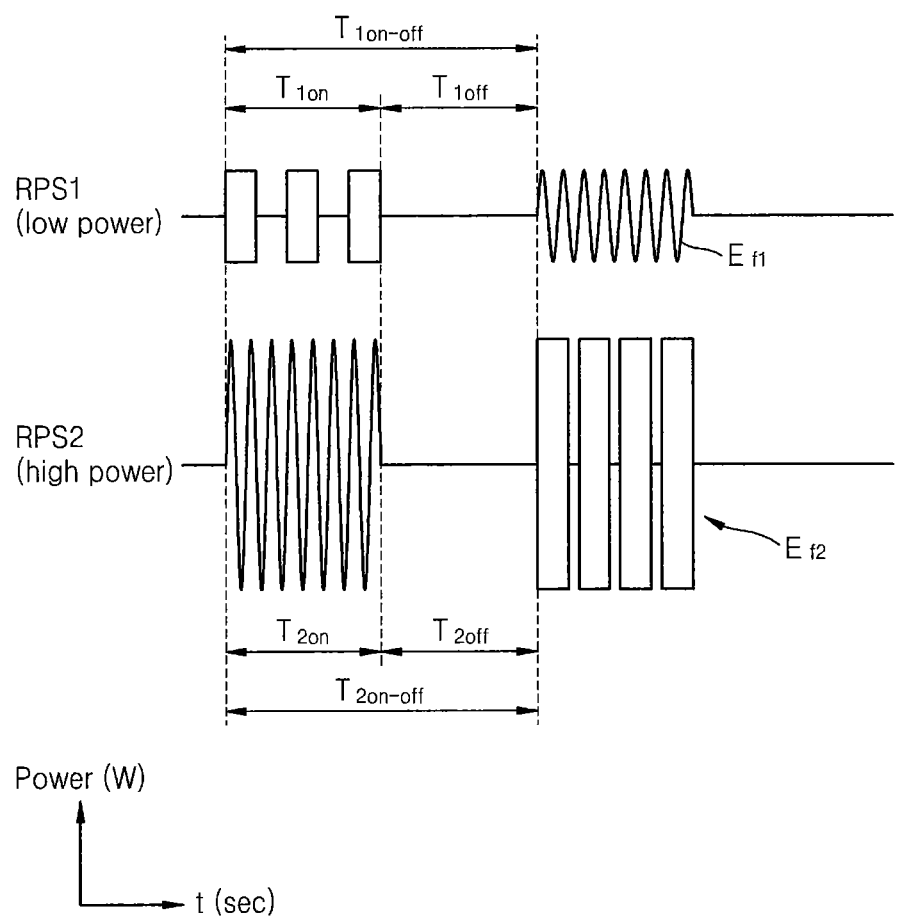
Figure 18:
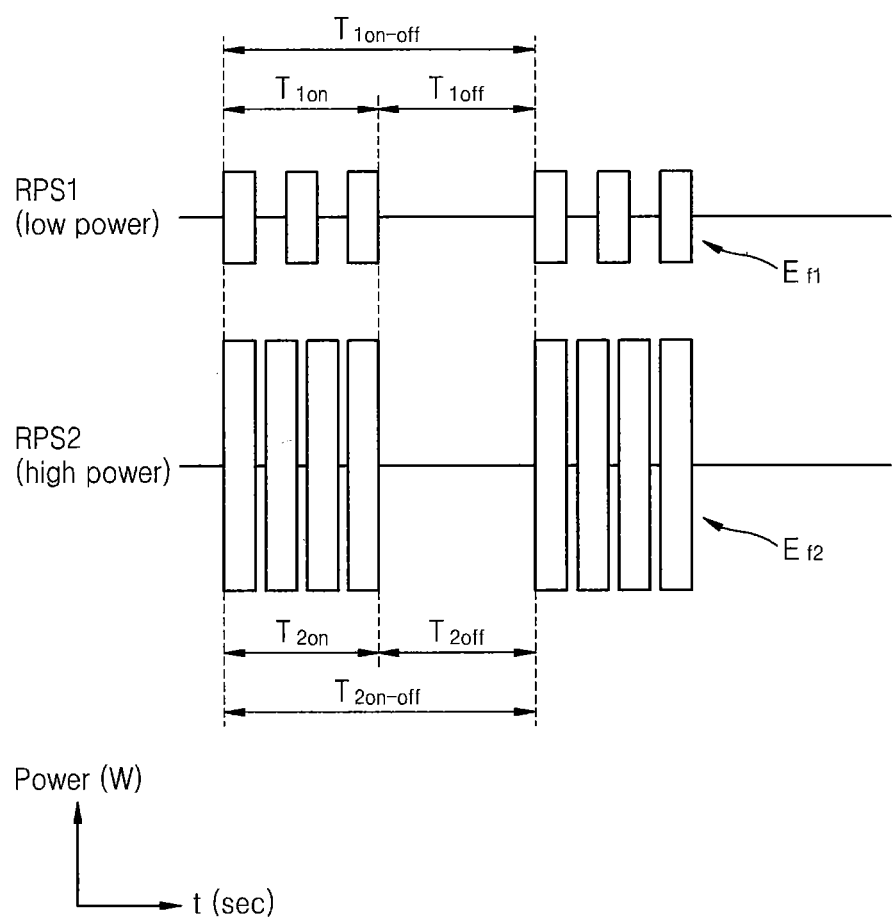

FIGS. 16 through 18 are waveform diagrams showing the application of EMWs in a method of generating plasma using two RPSs according to an exemplary embodiment of the inventive concept.

Referring to FIG. 16, as in the method of FIG. 11, in a method of generating plasma according to the present embodiment, all first EMWs $E_{f1}$ are periodically applied as a CW to the first RPS RPS1, and all second EMWs $E_{f2}$ may also be periodically applied as a CW to the second RPS RPS2. Furthermore, first on-off time period $T_{1on-off}$ and second on-off time period $T_{2on-off}$ may have the same time interval.

However, unlike in the previous embodiments, the low-power on time period or section $T_{1on}$ may be concurrent with or correspond to the high-power on time period or section $T_{2on}$, and the low-power off time period or section $T_{1off}$ may be concurrent with or correspond to the high-power off time section $T_{2off}$. Thus, the second EMW $E_{f2}$ may be applied to the second RPS RPS2 during the low-power on time section $T_{1on}$ in which the first EMW $E_{f1}$ is applied to the first RPS RPS1, while the second EMW $E_{f2}$ may not be applied to the second RPS RPS2 during the low-power off time section $T_{1off}$ in which the first EMW $E_{f1}$ is not applied to the first RPS RPS1. In other words, the first EMW $E_{f1}$ applied to the first RPS RPS1 and the second EMW $E_{f2}$ applied to the second RPS RPS2 may be simultaneously turned on and off.

When one RPS is used, simultaneous application of a low-power EMW and a high-power EMW may not be performed. Even if the low-power EMW and the high-power EMW are applied, the same effects as when only the high-power EMW is applied may be generally obtained. Thus, two plasmas cannot be generated by simultaneously applying the low-power EMW and the high-power EMW. Also, since one RPS is used, different types of process gases cannot be additionally supplied according to required plasma. However, in a method of generating plasma according to the present embodiment, since two RPSs are used and spaced apart from each other, an EMW applied to one RPS may not affect other RPSs. Accordingly, even if the low-power EMW and the high-power EMW are simultaneously applied, the above-described problems caused by using one RPS may not occur. Furthermore, process gases may be independently supplied to the respective RPSs. Thus, required high-quality plasma may be generated by simultaneously applying the low-power EMW and the high-power EMW to the respective RPSs.

Referring to FIG. 17, a method of generating plasma according to the present embodiment may correspond to a combination of the methods of generating plasma described with reference to FIGS. 12 and 16. For example, similar to the method of FIG. 12, while a first EMW $E_{f1}$ is periodically applied to the first RPS RPS1, the first EMW $E_{f1}$ may be pulsed and applied in at least one period portion. Also, while a second EMW $E_{f2}$ is periodically applied to the second RPS RPS2, the second EMW $E_{f2}$ may be pulsed and applied in at least one period portion. In addition, the method of generating plasma according to the present embodiment may be similar to the method of FIG. 16 in that the first EMW $E_{f1}$ and the second EMW $E_{f2}$ are simultaneously turned on and off.

Referring to FIG. 18, a method of generating plasma according to the present embodiment may correspond to a combination of the methods of generating plasma described with reference to FIGS. 15 and 16. For example, the method of generating plasma may be similar to the method of FIG. 15 in that all first EMWs $E_{f1}$ are periodically pulsed and applied to the first RPS RPS1, and all second EMWs $E_{f2}$ are periodically pulsed and applied to the second RPS RPS2. Also, the method of generating plasma according to the present embodiment may be similar to the method of FIG. 16 in that the first EMW $E_{f1}$ and the second EMW $E_{f2}$ are simultaneously turned on and off.

Figure 19:
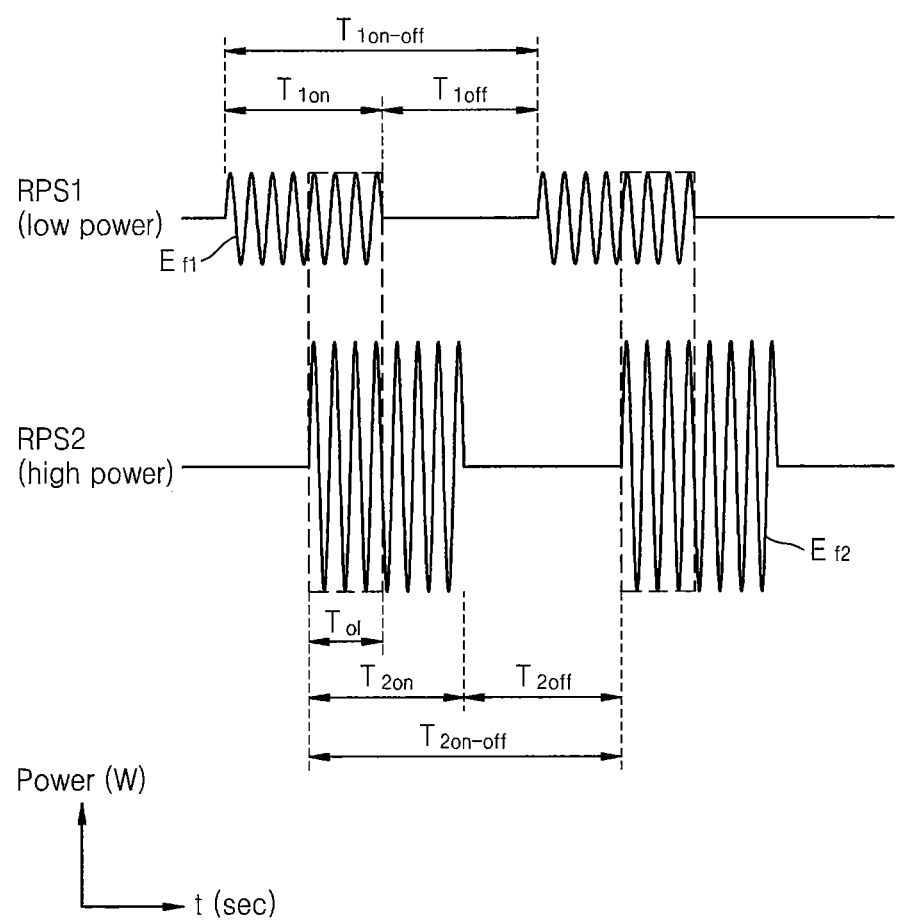
FIGS. 19 through 21 are waveform diagrams showing the application of EMWs in a method of generating plasma using two RPSs according to an exemplary embodiment of the inventive concept.
Figure 20:
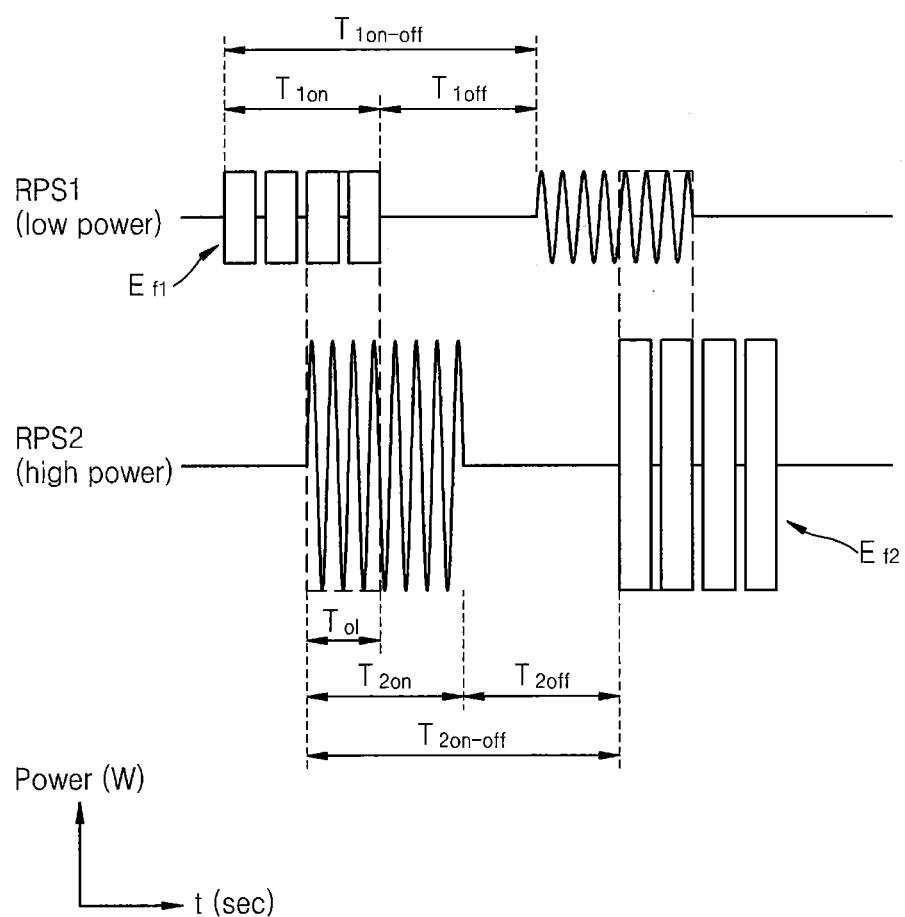
Figure 21:
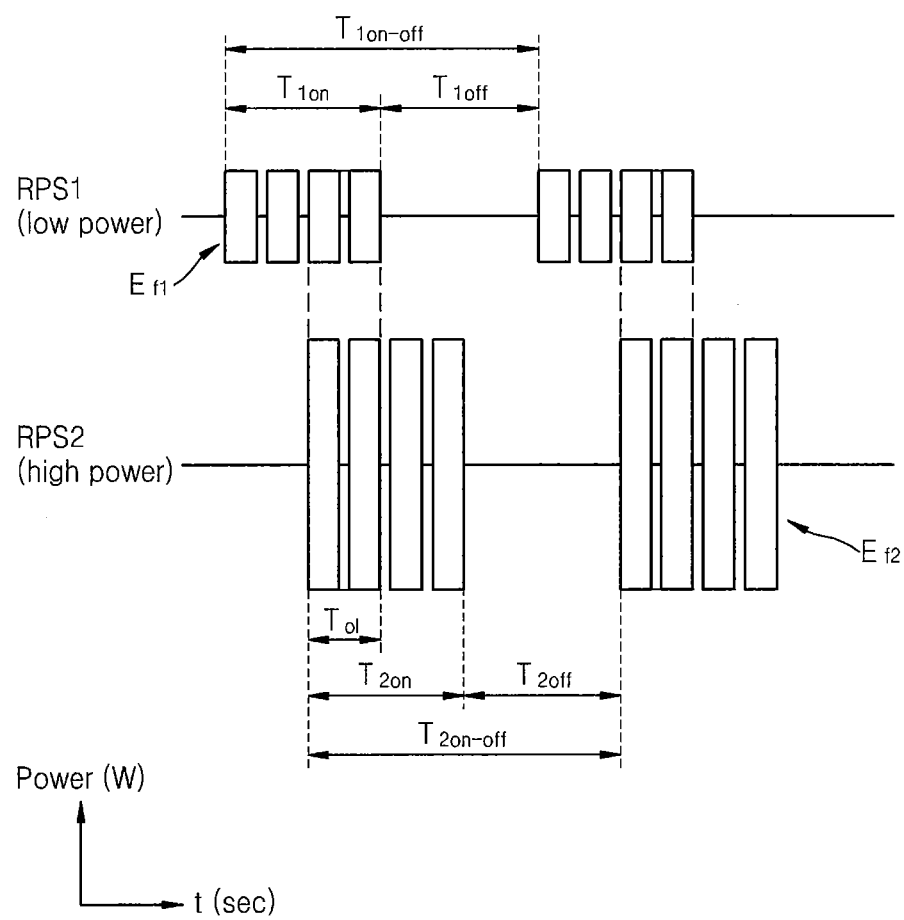

FIGS. 19 through 21 are waveform diagrams showing the application of EMWs in a method of generating plasma using two RPSs according to an exemplary embodiment of the inventive concept.

Referring to FIG. 19, as in the method of FIG. 11, in a method of generating plasma according to the present embodiment, all first EMWs $E_{f1}$ may be periodically applied as a CW to the first RPS RPS1, and all second EMWs $E_{f2}$ may be periodically applied as a CW to the second RPS RPS2. Also, the first on-off time period $T_{1on-off}$ and the second on-off time period $T_{2on-off}$ may have the same time interval.

However, unlike in the previous embodiments, a portion of the low-power on time period or section $T_{1on}$ may overlap a portion of the high-power on time period or section $T_{2on}$. In FIG. 19, an overlap or overlay period or section $T_{o1}$ between the portion of the low-power on time section $T_{1on}$ and the portion of the high-power on time section $T_{2on}$ is illustrated with dotted lines. Meanwhile, since the portion of the low-power on time section $T_{1on}$ overlaps the portion of the high-power on time section $T_{2on}$, a portion of the low-power off time period or section $T_{1off}$ may overlap a portion of the high-power off time period or section $T_{2off}$. Thus, during (e.g., in the middle of) the low-power on time section $T_{1on}$ in which the first EMW $E_{f1}$ is applied to the first RPS RPS1, the second EMW $E_{f2}$ may be turned on and applied to the second RPS RPS2, and the first EMW $E_{f1}$ may be turned off during the application of the second EMW $E_{f2}$. Also, the first EMW $E_{f1}$ may be turned on during (e.g., in the middle of) the high-power off time section $T_{2off}$, and the second EMW $E_{f2}$ may be turned on during the application of the first EMW $E_{f1}$.

Referring to FIG. 20, a method of generating plasma according to the present embodiment may correspond to a combination of the methods of generating plasma described with reference to FIGS. 12 and 19. For example, similar to the method of FIG. 12, while a first EMW $E_{f1}$ is periodically applied to the first RPS RPS1, the first EMW $E_{f1}$ may be pulsed and applied in at least one period portion. Also, while a second EMW $E_{f2}$ is periodically applied to the second RPS RPS2, the second EMW $E_{f2}$ may be pulsed and applied in at least one period portion. Also, the method of generating plasma according to the present embodiment may be similar to the method of FIG. 19 in that, while the first EMW $E_{f1}$ and the second EMW $E_{f2}$ are applied, a portion of the low-power on time period or section $T_{1on}$ overlaps a portion of the high-power on time period or section $T_{2on}$.

Referring to FIG. 21, a method of generating plasma according to the present embodiment may correspond to a combination of the methods of generating plasma described with reference to FIGS. 15 and 19. For instance, the method of generating plasma described with reference to FIG. 21 may be similar to the method of FIG. 15 in that all first EMWs $E_{f1}$ are periodically pulsed and applied to the first RPS RPS1, and all second EMWs $E_{f2}$ are also periodically pulsed and applied to the second RPS RPS2. Also, the method of generating plasma according to the present embodiment may be similar to the method of FIG. 19 in that, while the first EMWs $E_{f1}$ and the second EMWs $E_{f2}$ are applied, a portion of the low-power on time period or section $T_{1on}$ overlaps a portion of the high-power on time period or section $T_{2on}$.

Methods of applying EMW powers according to various exemplary embodiments of the inventive concept are described above, but the inventive concept is not limited thereto. For example, it will be understood that methods of independently generating two plasmas using one or two RPSs by independently applying EMWs having different powers and supplying different process gases fall within the scope of the present inventive concept.

Figure 22A:
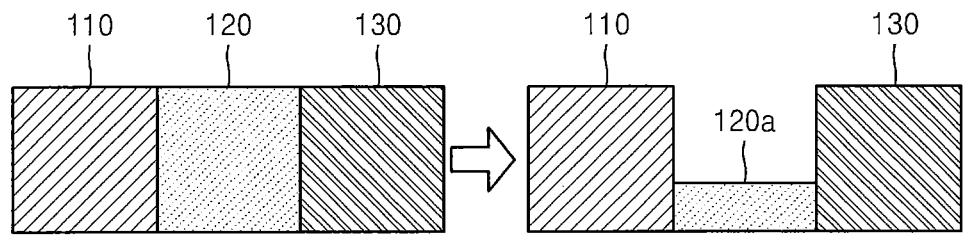
FIGS. 22A through 22C are diagrams illustrating a process of etching a material layer disposed on a semiconductor substrate by using plasma generated from an RPS, according to an exemplary embodiment of the inventive concept.
Figure 22B:
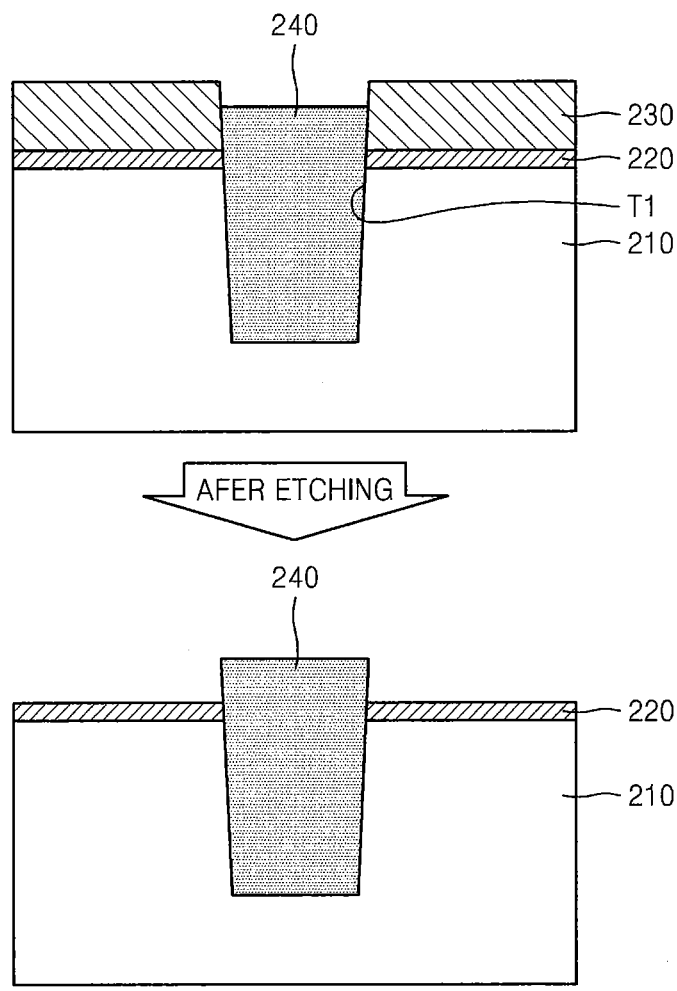
Figure 22C:
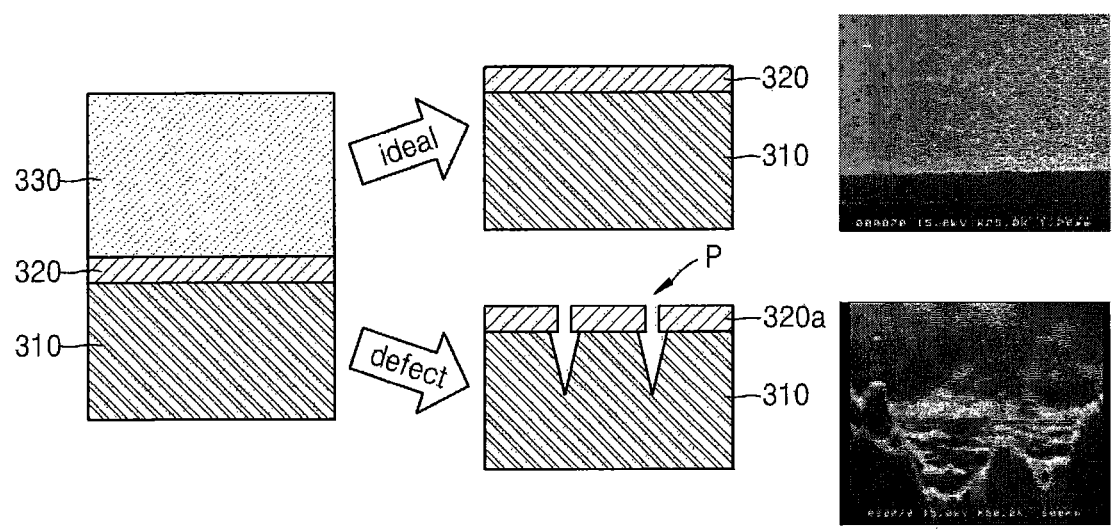

FIGS. 22A through 22C are diagrams illustrating a process of etching a material layer disposed on a semiconductor substrate by using plasma generated from an RPS, according to an exemplary embodiment of the inventive concept.

Referring to FIG. 22A, an oxide layer 110, a nitride layer 120, and a poly-Si layer 130 may be formed together on a substrate (not shown), and only the nitride layer 120 may need to be isotropically etched to a predetermined thickness. In this case, the nitride layer 120 may be etched using plasma generated using the methods of generating plasma according to the present embodiments. Thus, only the nitride layer 120 may be etched to a required thickness with an optimized selectivity without damaging the oxide layer 110 and the poly-Si layer 130. In a right portion of FIG. 22A, a nitride layer 120a is maintained at a predetermined thickness. However, the nitride layer 120 may be completely etched by controlling the amount or type of the plasma or an etch time. Here, the plasma may refer to a radical element used for the isotropic etching of the corresponding material layer.

For example, in the methods of generating plasma according to the present embodiment, to isotropically etch the nitride layer 120, a fluorine-based gas, such as $NF_3$, $CF_4$, $CHF_3$, or $CH_2F_2$, may be supplied as the first process gas into the first RPS (refer to 132 in FIG. 1, for example), and an oxide-based gas, such as $O_2$, $N_2O$, or NO, may be supplied as the second process gas into the second RPS (refer to 134 in FIG. 1, for example). Furthermore, each of the first process gas and the second process gas may further include $N_2$, Ar, He, or $H_2$. Meanwhile, the inside of the process chamber 110 may be maintained under a pressure of several tens of mtorr to several torr at a temperature of about 0° C. Meanwhile, a power applied to the first RPS 132 may range from several tens of watts to several hundred watts, and a low power applied to the second RPS 134 may range from several hundred watts to several thousand watts. Also, each carrier frequency may be appropriately selected from frequencies corresponding to the above-described RF or microwave. EMWs may be pulsed at a pulse frequency of several to several tens or several hundred kHz. When plasma is generated under the above-described process conditions, first plasma containing a fluorine radical may be generated in the first RPS 132, and second plasma containing a NO radical may be generated in the second RPS 134.

Meanwhile, the nitride layer ($Si_3N_4$) may be etched using plasmas generated using the methods of generating plasma according to the present embodiments, for example, the first plasma containing the fluorine radical and the second plasma containing the NO radical. Thus, an etch selectivity of about 60 or higher may be obtained with respect to the oxide layer ($SiO_2$), and an etch selectivity of about 40 or higher may be obtained with respect to the poly-Si layer. Also, pitting may be reduced or prevented, and a surface uniformity of less than 3% may be maintained. Meanwhile, an etch rate of the nitride layer ($Si_3N_4$) may range from 500 Å/min to 1000 Å/min.

For reference, the oxide layer may be isotropically etched under similar conditions to the above-described conditions under which the nitride layer is etched, except that a high temperature of about 150° C. or higher is maintained and a process gas further contains $NH_3$. Also, the poly-Si layer may be isotropically etched under similar conditions to the conditions under which the nitride layer is etched, except that a temperature of about 60° C. is maintained. Meanwhile, when the oxide layer or the poly-Si layer is etched, the supplied amounts of process gases may be quite different from the amounts of process gases supplied to etch the nitride layer, and EMWs having different powers may be applied using different application methods. For reference, when an EMW having a lower power is applied, the dissociation of process gases may be low, so that only a small number of types of radicals can be generated in small amounts. In contrast, when an EMW having a high power is applied, the dissociation of process gases may be high, so that a large number of types of radicals can be generated in large amounts. Accordingly, even if the same types of process gases are included, different radicals may be generated in quite different amounts according to the amounts of the process gases and powers and application methods of EMWs.

As can be seen from an upper portion of FIG. 22B, an oxide layer 220 and a nitride layer 230 may be formed on a silicon substrate 210, and a trench T1 may penetrate the nitride layer 230 and the oxide layer 220 and extend into the silicon substrate 210. Thereafter, a shallow trench isolation (STI) 240 may be formed by filling the trench T1 with an oxide layer. Here, the nitride layer 230 may be used as a hard mask for forming the trench T1, and may need to be completely removed using an isotropic etching process after forming the STI 240. In this case, the nitride layer 230 may be etched using plasma generated using the methods of generating plasma according to the present embodiments. Thus, as shown in a lower portion of FIG. 22B, only the nitride layer 230 may be completely removed by etching without damaging the oxide layer 220 and the STI 240.

Referring to FIG. 22C, an oxide layer 320 and a nitride layer 330 may be formed on a poly-Si layer 310, and the nitride layer 330 may be removed using an isotropic etching process. FIG. 22C shows a comparison between a case (a right upper portion) in which the nitride layer 330 was etched using plasma generated using the method of generating plasma according to the present embodiments and a case (a right lower portion) in which the nitride layer 330 was etched using conventional direct plasma.

As shown in FIG. 22C, it can be confirmed that after the nitride layer 330 was removed using plasma generated using the method of generating plasma according to the present embodiments, little to no pitting occurred in the oxide layer 320 and the poly-Si layer 310, and the oxide layer 320 maintained a smooth top surface. In contrast, after the nitride layer 330 was removed using conventional direct plasma, it can be confirmed that a plurality of pittings P were generated in the oxide layer 320 and the poly-Si layer 310. Thus, it can be seen that substantial damage occurred to the oxide layer 320 and the poly-Si layer 310 during the etching process.

Figure 23:
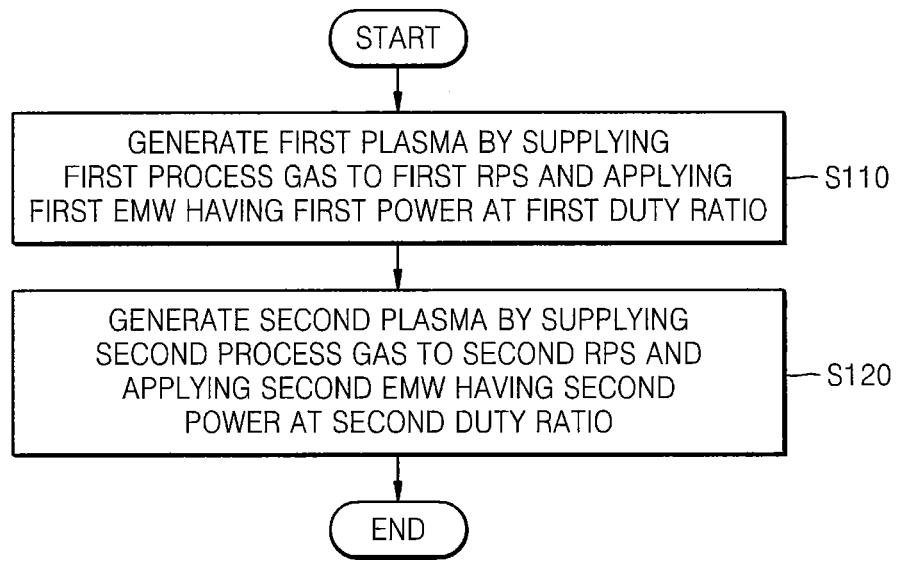
FIG. 23 is a flowchart illustrating a method of generating plasma using two RPSs according to an exemplary embodiment of the inventive concept.

FIG. 23 is a flowchart illustrating a method of generating plasma using two RPSs according to an exemplary embodiment of the inventive concept. FIG. 23 will be described with reference to FIGS. 1 and 11 through 21 in the interest of brevity.

Referring to FIG. 23, to begin with, in the method of generating plasma according to the present embodiment, a first process gas may be applied to the first RPS 132, and a first EMW $E_{f1}$ having a first power may be applied at a first duty ratio to generate first plasma P1 (S110). The first process gas may be, for example, fluorine-based gas. The first power may be a low power of less than several hundred watts. Here, when an EMW is turned on and off and periodically applied, a duty ratio may be defined by a percentage of an on time section with respect to a period. In FIG. 11, the first duty ratio of the first EMW $E_{f1}$ may be expressed by $T_{1on}/T_{1on-off}*100(\%)$. For example, when the low-power on time period or section $T_{1on}$ of the first EMW $E_{f1}$ has a duration of 10 seconds and the low-power off time period or section $T_{1off}$ has a duration of 10 seconds, the first on-off time period $T_{1on-off}$ may have a duration of 20 seconds and a duty ratio of 50%. Meanwhile, when a duty ratio is 100%, it can be inferred that EMWs are continuously applied without a low-power off time section. Accordingly, the first EMW $E_{f1}$ may be applied to the first RPS 132 according to the first duty ratio in various manners.

Next, a second process gas may be supplied to the second RPS 134, and a second EMW $E_{f2}$ having a second power may be applied at a second duty ratio to generate second plasma P2 (S120). The second process gas may be, for example, oxide-based gas. The second power may be a high power of several hundred watts or more. In FIG. 11, the second duty ratio of the second EMW $E_{f2}$ may be expressed by $T_{2on}/T_{2on-off}*100(\%)$.

In the method of generating plasma according to the present embodiment, after the first plasma P1 is generated, the second plasma P2 may be generated. However, the inventive concept is not limited to the above-described example. For example, after the second plasma P2 is generated, the first plasma P1 may be generated. Alternatively, the first plasma P1 and the second plasma P2 may be simultaneously generated. Meanwhile, the first plasma P1 and second plasma P2 may be generated in various orders according to the methods of applying powers of the first and second EMWs $E_{f1}$ and $E_{f2}$ shown in FIGS. 11 through 21.

Figure 24:
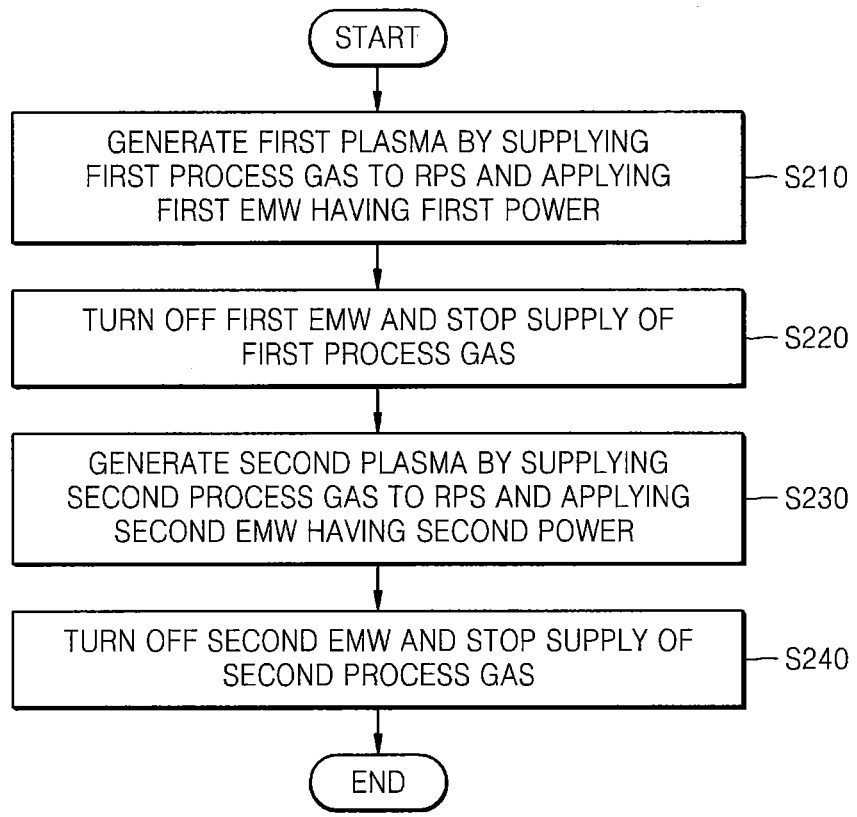
FIG. 24 is a flowchart illustrating a method of generating plasma using one RPS according to an exemplary embodiment of the inventive concept.

FIG. 24 is a flowchart illustrating a method of generating plasma using one RPS according to an exemplary embodiment of the inventive concept. FIG. 24 will be described with reference to FIGS. 1 and 3 through 10 for brevity.

Referring to FIG. 24, to begin with, in the method of generating plasma according to the present embodiment, a first process gas may be supplied to an RPS, and a first EMW $E_{f1}$ having a first power may be applied to generate first plasma P1 (S210). Since only one RPS is used, the RPS may be the first RPS 132 or the second RPS 134 of the semiconductor device fabrication apparatus 100 of FIG. 1. In some cases, the RPS may be an RPS of a semiconductor device fabrication apparatus including only one RPS or any one RPS of a semiconductor device fabrication apparatus including three or more RPSs. The first process gas and the first power may be the same as described above with reference to FIG. 23.

Meanwhile, in the method of generating plasma according to the present embodiment, when a first EMW $E_{f1}$ and a second EMW $E_{f2}$ have the same power application time section and are repeated, a duty ratio of the first EMW $E_{f1}$ may be defined. For instance, when the low-power time period or section $T_{low}$ is equal to the high-power time period or section $T_{high}$ and the application of the first EMW $E_{f1}$ is repeated during the power application time period $T_{11}$ as in FIG. 3, the duty ratio of the first EMW $E_{f1}$ may be expressed by $T_{11}/T_{low}*100(\%)$. The first EMW $E_{f1}$ may be applied in various methods exemplarily shown in FIGS. 4 through 10. Naturally, the application of the first EMW $E_{f1}$ in other methods than the methods shown in FIGS. 4 through 10 is not excluded from the scope of the inventive concept.

Next, the first EMW $E_{f1}$ may be turned off, and the supplying of the first process gas may be stopped (S220). Operation S220 of stopping the supplying of the first process gas may correspond to the second low-power time section $T_{12}$ of FIG. 3, and a gas stabilization function may be performed in operation S220. Meanwhile, in operation S220 of stopping the supplying of the first process gas, the second process gas may be supplied to generate subsequent second plasma P2.

Subsequently, a second process gas may be supplied to the RPS, and a second EMW $E_{f2}$ having a second power may be applied to generate second plasma P2 (S230). The RPS may be the same as the RPS used to previously generate the first plasma P1. The second process gas and the second power may be the same as described above with reference to FIG. 23. Meanwhile, when the first EMW $B_{f1}$ and the second EMW $E_{f2}$ have the same power application time section and are repeated, a duty ratio of the second EMW $E_{f2}$ may be defined. For example, in the case of FIG. 3, the duty ratio of the second EMW $E_{f2}$ may be expressed by $T_{21}/T_{high}*100(\%)$. The second EMW $E_{f2}$ may be applied using various methods described with reference to FIGS. 4 through 10. Naturally, the application of the second EMW $E_{f2}$ in other methods than the methods described with reference to FIGS. 4 through 10 is not excluded from the scope of the inventive concept.

Next, the second EMW $E_{f2}$ may be turned off, and the supplying of the second process gas may be stopped (S240). Operation S240 of stopping the supplying of the second process gas may correspond to the second high-power time section $T_{22}$ of FIG. 3, and a gas stabilization function may be performed in operation S240. Meanwhile, in operation S240 of stopping the supplying of the second process gas, the first process gas may be supplied to generate subsequent first plasma P1.

Figure 25:
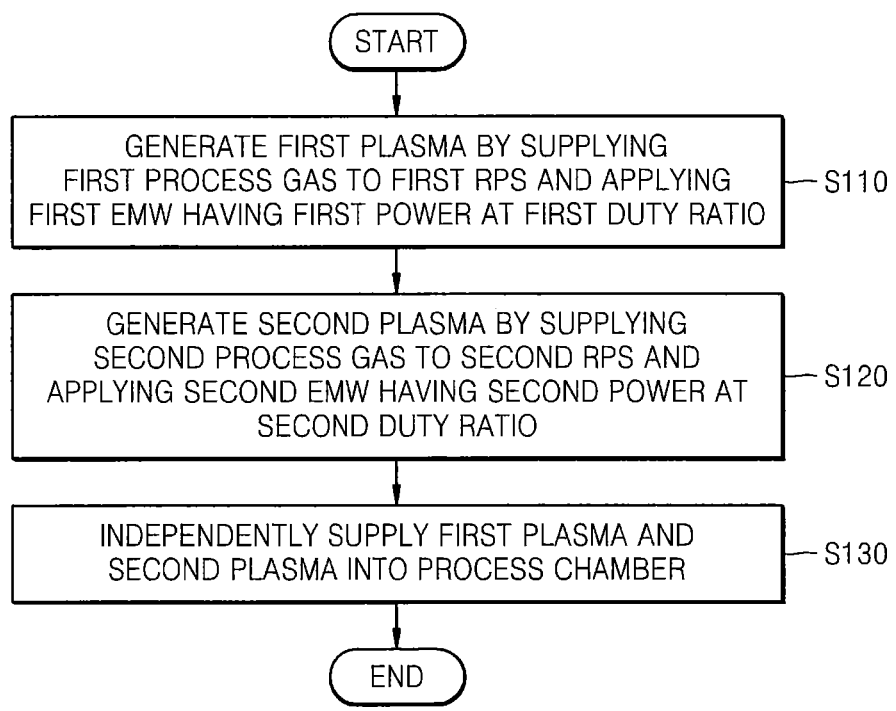
FIG. 25 is a flowchart illustrating a method of fabricating a semiconductor device using two RPSs according to an exemplary embodiment of the inventive concept.

FIG. 25 is a flowchart illustrating a method of fabricating a semiconductor device using two RPSs according to an exemplary embodiment of the inventive concept. FIG. 25 will be described with reference to FIGS. 1 and 11 through 21 in the interest of brevity.

Referring to FIG. 25, to begin with, in the method of fabricating a semiconductor device according to the present embodiment, a first process gas may be applied to the first RPS 132, and a first EMW $E_{f1}$ having a first power may be applied at a first duty ratio to generate first plasma P1 (S110). Also, a second process gas may be applied to the second RPS 134, and a second EMW $E_{f2}$ having a second power may be applied at a second duty ratio to generate second plasma P2 (S120). Operation S110 of generating the first plasma and operation S120 of generating the second plasma may be the same as described with reference to FIG. 23 and thus, detailed descriptions thereof are omitted here.

Next, the generated first plasma P1 and second plasma P2 may be independently supplied to the process chamber 110 (S130). For example, the first plasma P1 may be supplied through the first showerhead 152 into the process chamber 110, while the second plasma P2 may be supplied through the second showerhead 154 into the process chamber 110. Meanwhile, the supplying of the first plasma P1 and the second plasma P2 into the process chamber 110 may refer to etching the etching target 200 placed on the stage 120, for example, the substrate or the material layer disposed on the substrate.

The first plasma P1 and the second plasma P2 may be sequentially supplied to the process chamber 110. For instance, after the first plasma P1 is supplied, the second plasma P2 may be supplied. In some cases, the first plasma P1 and the second plasma P2 may be supplied in reverse order. Alternatively, the first plasma P1 and second plasma P2 may be simultaneously supplied.

Meanwhile, the supplying of the first plasma P1 and the second plasma P2 may refer to not supplying the entire first plasma P1 but supplying a radical contained in the first plasma P1. That is, the supply of ions or electrons contained in the first plasma P1 may be cut off while the first plasma P1 is passing through the first holes 152H, and only the radical may be supplied into the process chamber 110. The supplying of the second plasma P2 may be interpreted in a like fashion.

In addition, when the substrate or the material layer disposed on the substrate needs to be anisotropically etched, ions may be needed. In this case, ions may be generated from the radical contained in the process chamber 110 by applying a bias through the bias application unit 170. The substrate or the material layer disposed on the substrate may be anisotropically etched using the generated ions.

Figure 26:
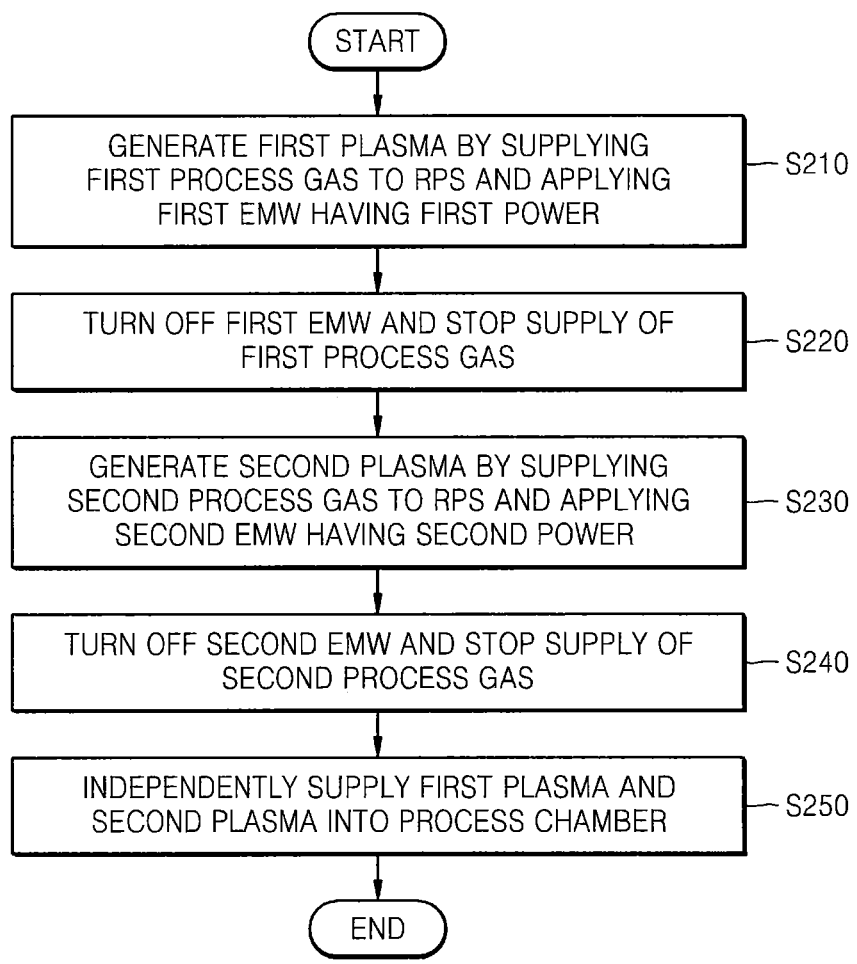
FIG. 26 is a flowchart illustrating a method of fabricating a semiconductor device using one RPS according to an exemplary embodiment of the inventive concept.

FIG. 26 is a flowchart illustrating a method of fabricating a semiconductor device using one RPS according to an exemplary embodiment of the inventive concept. FIG. 26 will be described with reference to FIGS. 1 and 3 through 10 in the interest of brevity.

Referring to FIG. 26, to begin with, in the method of fabricating a semiconductor device according to the present embodiment, a first process gas may be supplied to an RPS, and a first EMW $E_{f1}$ having a first power may be applied to generate first plasma P1 (S210). Next, the first EMW $E_{f1}$ may be turned off, and the supplying of the first process gas may be stopped (S220). Subsequently, a second process gas may be supplied to the RPS, and a second EMW $E_{f2}$ having a second power may be applied to generate second plasma P2 (S230). Thereafter, the second EMW $E_{f2}$ may be turned off, and the supplying of the second process gas may be stopped (S240). Operation S210 of generating the first plasma through operation S240 of stopping the supplying of the second process gas may be the same as described with reference to FIG. 24 and thus, detailed descriptions thereof are omitted here.

Subsequently, the generated first plasma P1 and second plasma P2 may be independently supplied to the process chamber 110 (S250). The supplying of the first plasma P1 and the second plasma P2 into the process chamber 110 may be the same as described with reference to FIG. 25 except supplying from one RPS and thus, detailed descriptions thereof are omitted here.

FIG. 27 is a schematic configuration diagram of a semiconductor device fabrication apparatus 100b including an RPS according to an exemplary embodiment of the inventive concept.

Referring to FIG. 27, the semiconductor device fabrication apparatus 100b according to the present embodiment may be similar to the semiconductor device fabrication apparatus 100a of FIG. 2 except that an RPS unit 130a further includes a third RPS 136. That is, the semiconductor device fabrication apparatus 100b according to the present embodiment may include three RPSs 132, 134, and 136.

As shown in FIG. 27, the third RPS 136 may be disposed outside a process chamber 110. The third RPS 136 may generate third plasma P3 from a third process gas. The third process gas may also contain at least one etch source gas. The third process gas may contain different gases than the first process gas and the second process gas. However, some gases contained in the third process gas may be the same as gases contained in the first and second processes. Also, the third RPS 136 may generate the third plasma P3 from the third process gas under a third process condition different from the first process condition and second process condition. When the third process gas is different from the first process gas and the second process gas, a third process condition optimized to generate the third plasma P3 for etching the substrate or the material layer disposed on the substrate from the third process gas may be different from the first process condition and the second process condition. The third process condition may depend on the type of third process gas. The third process condition may include pressure, temperature, and power conditions.

Meanwhile, as described above, in the semiconductor device fabrication apparatus 100b according to the present embodiment, a power application method may greatly contribute to generating and controlling plasma. For example, to generate the third plasma P3, a third EMW having a third frequency and a third power may be applied as a CW type or may be pulsed and applied with a third on-off time period. In addition, the third frequency, third power, and third on-off time period of the third EMW may be equal to or different from the first frequency, first power, and first on-off time period of the first EMW and the second frequency, second power, and second on-off time period of the second EMW. For example, while all of the first through third frequencies may be equal and all of the first through third on-off time periods may be equal, the first power, the second power, and the third power may be respectively different. A power application method of the third process condition will be described in detail below with reference to FIG. 28 along with the power application methods of the first and second process conditions.

The third plasma P3 may contain a plurality of elements. At least one of the plurality of elements, namely, a third element, may be mainly used to etch the substrate or the material layer disposed on the substrate. For example, the third plasma P3 may contain a third radical R3, third ions I3, electrons, and UV rays. Like the first radical R1 and the second radical R2, the third radical R3 may isotropically etch the substrate or the material layer disposed on the substrate. In contrast, the third ion I3 may anisotropically etch the substrate or the material layer disposed on the substrate.

Accordingly, in the semiconductor device fabrication apparatus 100b according to the present embodiment, when the substrate or the material layer disposed on the substrate is isotropically etched, the third radical R3 may be mainly used, and the third ions I3, the electrons, and UV rays may be prevented from being supplied through a third supply pipe or passageway 146 into the process chamber 110.

Meanwhile, the third RPS 136 may be connected through the third supply pipe 146 to the inside of the process chamber 110. Thus, the third supply pipe 146 may serve as a showerhead. That is, the third plasma P3 generated in the third RPS 136 may be sprayed through the third supply pipe 146 into the process chamber 110. The third supply pipe 146 may function to block ions or electrons like the first and second holes 152H and 154H so that only the third radical R3 contained in the third plasma P3 can be supplied into the process chamber 110.

The third supply pipe 146 may be configured to penetrate the showerhead unit 150. Meanwhile, although only one third supply pipe 146 is illustrated in FIG. 27, a plurality of third supply pipes 146 may be formed in other embodiments. The third supply pipe 146 may not be directly connected to the process chamber 110 but connected to the showerhead unit 150. That is, the showerhead unit 150 may include a third showerhead to which the third supply pipe 146 is connected, and the third plasma P3 may be supplied into the process chamber 110 through a plurality of third holes or passageways formed in the third showerhead. Meanwhile, FIG. 27 illustrates a case in which the second RPS 134 is connected to the second showerhead 154 through the second supply pipe 144a having the same structure as in the semiconductor device fabrication apparatus 100a of FIG. 2. However, in other embodiments, the second RPS 134 may be connected to the second showerhead 154 through the second supply pipe 144 having the same structure as in the semiconductor device fabrication apparatus 100 of FIG. 1.

Figure 28:
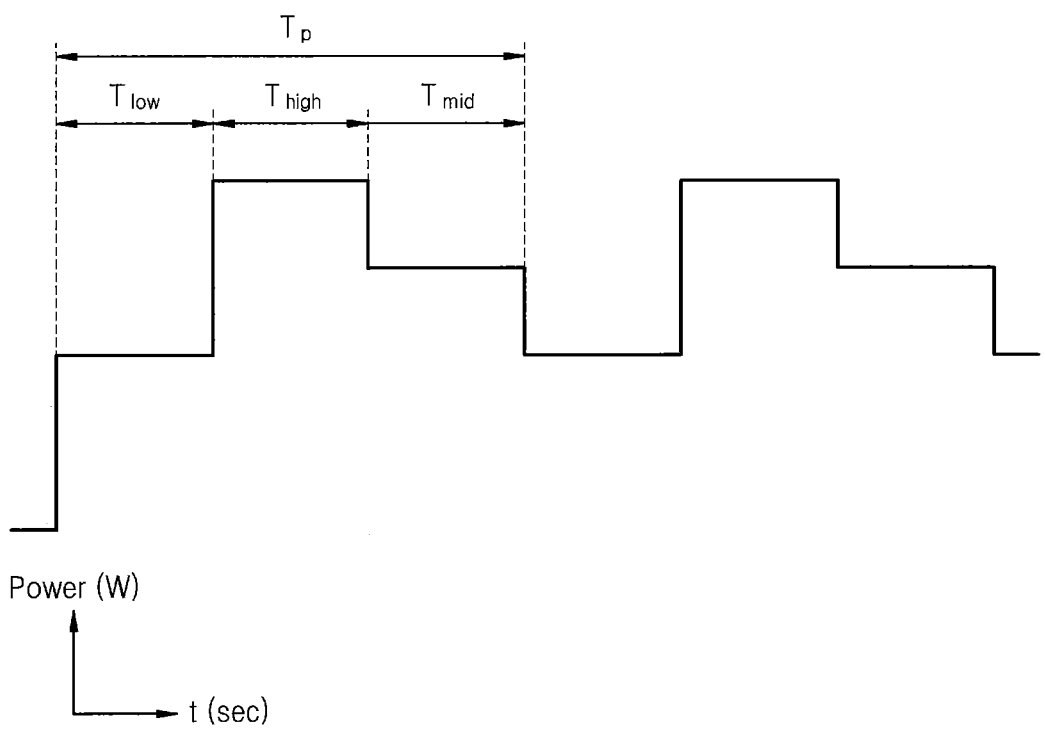
FIG. 28 is a waveform diagram of energy applied to generate plasma using three RPSs according to an exemplary embodiment of the inventive concept.

FIG. 28 is a waveform diagram of energy applied to generate plasma using three RPSs according to an exemplary embodiment of the inventive concept. FIG. 28 will be described with reference to FIG. 27 in the interest of brevity.

Referring to FIG. 28, in a method of generating plasma according to the present embodiment, since three RPSs are used, energy may be applied without a gas stabilization step. For example, a power application time period $T_p$ may be a sum of a low-power time period or section $T_{low}$, a high-power time period or section $T_{high}$, and an intermediate- or middle-power time period or section $T_{mid}$, and the gas stabilization step may not be present among the respective sections. For instance, the low-power time section $T_{low}$ may be a section in which a first EMW is applied to the first RPS 132, the high-power time section $T_{high}$ may be a section in which a second EMW is applied to the second RPS 134, and the middle-power time section $T_{mid}$ may be a time section in which a third EMW is applied to the third RPS 136. Meanwhile, as described with reference to FIGS. 11 through 15, a time section in which an EMW is applied in any one RPS may correspond to a time section in which an EMW is turned off in another RPS or in the other RPSs.

Meanwhile, FIG. 28 illustrates an example in which the high-power time section $T_{high}$ is followed by the middle-power time section $T_{mid}$, but the inventive concept is not limited thereto. The middle-power time section $T_{mid}$ may be replaced by a second high-power time section in which an EMW having a higher power than during the high-power time section $T_{high}$ is applied, or a second low-power time section in which an EMW having a lower power than during the low-power time section $T_{low}$ is applied.

During the respective periods or sections, the EMWs may be applied in CW forms or pulsed forms. For example, all of the first through third EMWs may be applied in the CW forms during a predetermined on-off time period, one or two of the first through third EMWs may be pulsed and applied during the on-off time period, or all of the first through third EMWs may be pulsed and applied during the on-off time period. Meanwhile, even if one or two of the first through third EMWs are pulsed, the entire corresponding EMW may be pulsed or the corresponding EMW may be pulsed only during at least one period.

Meanwhile, FIG. 28 illustrates an example in which three RPSs are used, but the inventive concept is not limited thereto. For example, a gas stabilization step (i.e., an EMW off step) may be between the respective sections as shown in FIG. 3, and a method of generating plasma may be embodied using only one RPS. Also, a method of applying the first through third EMWs during respectively different time sections has been described above based on the energy waveform diagram of FIG. 28, but the method of generating plasma according to the present embodiment is not limited thereto. For example, as in FIGS. 16 through 18, the first through third EMWs may be simultaneously turned on and off and applied. Also, any two of the first through third EMWs may be simultaneously turned on and off, while the remaining one thereof may alternate with the two EMWs. Furthermore, as in FIGS. 19 through 21 the first through third EMWs may be applied such that on time sections of the first through third EMWs partially overlap one another. Meanwhile, the first through third EMWs may have respectively different on-off time periods. In this case, overlap overlay sections between periods or sections of the first through third EMWs may vary.

Figure 29:
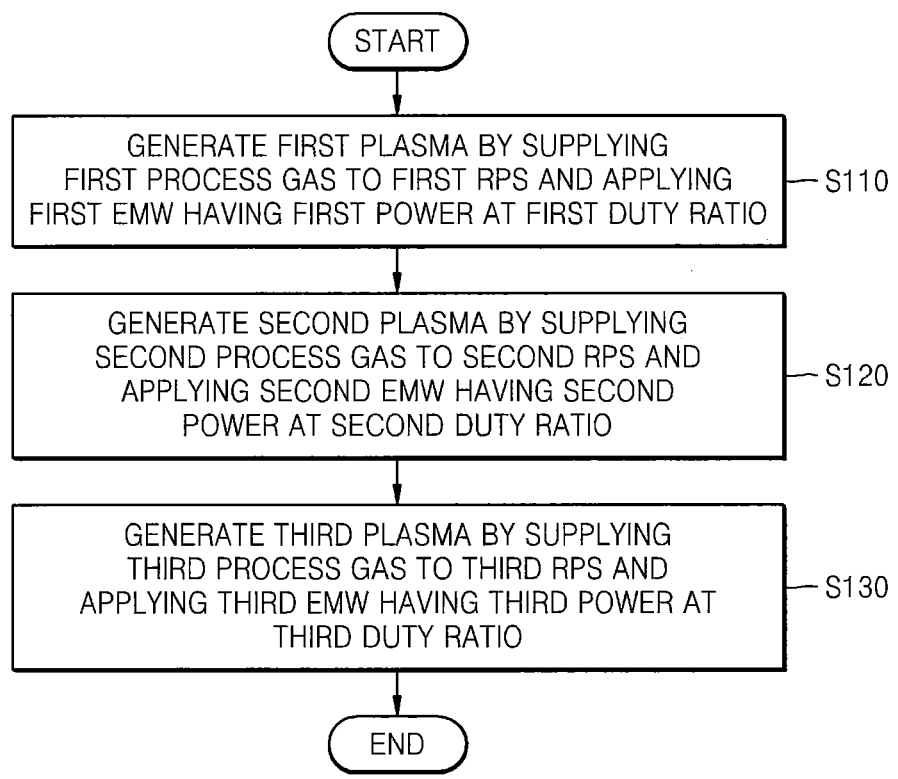
FIG. 29 is a flowchart illustrating a method of generating plasma using three RPSs according to an exemplary embodiment of the inventive concept.

FIG. 29 is a flowchart illustrating a method of generating plasma using three RPSs according to an exemplary embodiment of the inventive concept. FIG. 29 will be described with reference to FIGS. 27 and 28 in the interest of brevity.

Referring to FIG. 29, to begin with, in a method of generating plasma according to the present embodiment, a first process gas may be supplied to the first RPS 132, and a first EMW $E_{f1}$ having a first power may be applied at a first duty ratio to generate first plasma P1 (S110). Next, a second process gas may be supplied to the second RPS 134, and a second EMW $E_{f2}$ having a second power may be applied at a second duty ratio to generate second plasma P2 (S120). Operation S110 of generating the first plasma and operation S120 of generating the second plasma may be the same as described with reference to FIG. 23 and thus, detailed descriptions thereof are omitted here.

Thereafter, a third process gas may be supplied to the third RPS 136, and a third EMW $E_{f3}$ having a third power may be applied at a third duty ratio to generate third plasma P3 (S140). The third process gas may contain different gases than the first process gas and the second process gas. Also, the third power may be different from the first power and the second power. For example, the third power may be higher than the first power and lower than the second power. The third duty ratio may be equal to or different from the first duty ratio and the second duty ratio. Meanwhile, as described with reference to FIG. 23, the first through third plasmas P1, P2, and P3 may be generated sequentially or simultaneously.

Figure 30:
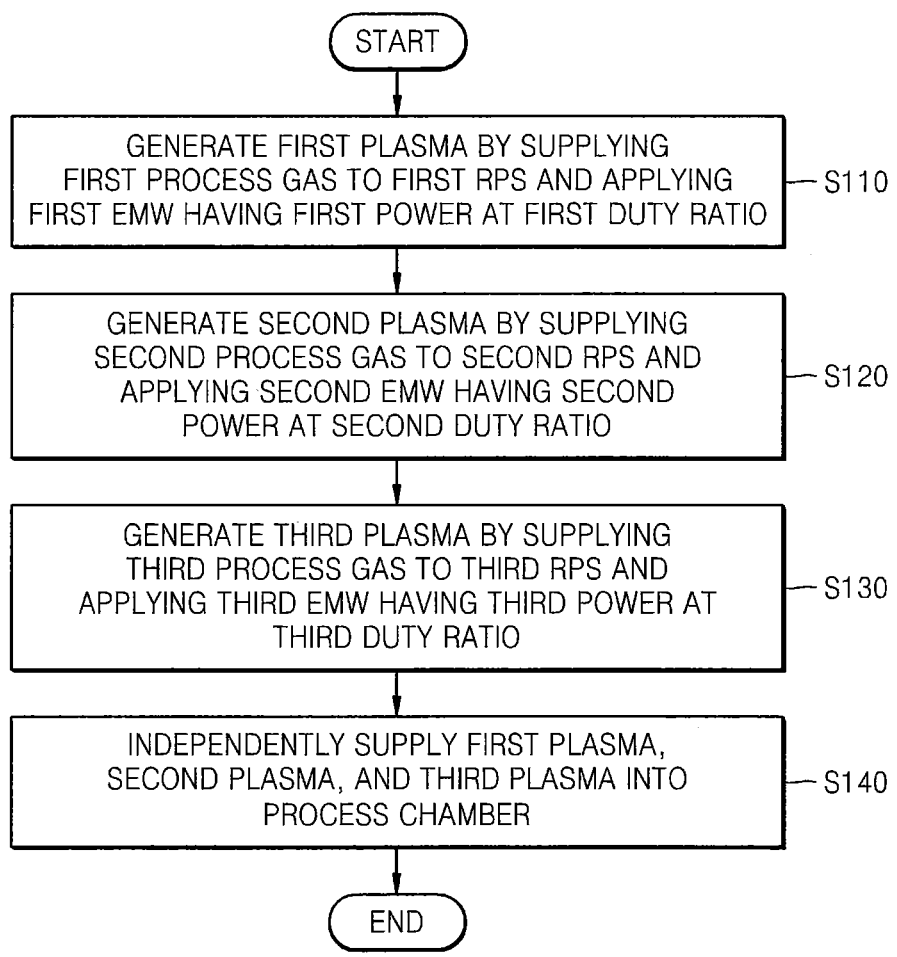
FIG. 30 is a flowchart illustrating a method of fabricating a semiconductor device using three RPSs according to an exemplary embodiment of the inventive concept.

FIG. 30 is a flowchart illustrating a method of fabricating a semiconductor device using three RPSs according to an exemplary embodiment of the inventive concept. FIG. 30 will be described with reference to FIGS. 27 and 28 in the interest of brevity.

Referring to FIG. 30, to begin with, in the method of fabricating a semiconductor device according to the present embodiment, a first process gas may be supplied to the first RPS 132, and a first EMW $E_{f1}$ having a first power may be applied at a first duty ratio to generate first plasma P1 (S110). Also, a second process gas may be supplied to the second RPS 134, and a second EMW $E_{f2}$ having a second power may be applied at a second duty ratio to generate second plasma P2 (S120). Next, a third process gas may be supplied to the third RPS 136, and a third EMW $E_{f3}$ having a third power may be applied at a third duty ratio to generate third plasma P3 (S140). Operation S110 of generating the first plasma, operation S120 of generating the second plasma, and operation S140 of generating the third plasma may be the same as described with reference to FIG. 29 and thus, detailed descriptions thereof are omitted here.

Next, the generated first plasma P1, second plasma P2, and third plasma P3 may be independently supplied into the process chamber 110 (S150). For example, the first plasma P1 may be supplied through the first showerhead 152 into the process chamber 110, and the second plasma P2 may be supplied through the second showerhead 154 into the process chamber 110. Also, the third plasma P3 may be supplied through the third supply pipe 146 into the process chamber 110. Naturally, the third plasma P3 may also be supplied through a showerhead into the process chamber 110. Meanwhile, the supplying of the first through third plasmas P1, P2, and P3 into the process chamber 110 may refer to etching the etching target 200 placed on the stage 120, for example, the substrate or the material layer disposed on the substrate.

The first through third plasmas P1, P2, and P3 may be supplied into the process chamber 110 sequentially or simultaneously. For instance, after the first plasma P1 is supplied, the second plasma P2 may be then supplied, and the third plasma P3 may be finally supplied. In some cases, the first through third plasmas P1, P2, and P3 may be supplied in different orders. Also, at least two of the first through third plasmas P1, P2, and P3 may be supplied simultaneously.

Meanwhile, the supplying of the first through third plasmas P1, P2, and P3 may refer to not wholly supplying each of the plasmas P1, P2, and P3 but supplying a radical contained in each of the plasmas P1, P2, and P3. That is, the supply of ions and electrons contained in the first plasma P1 may be cut off while the first plasma P1 is passing through the first holes 152H, and only a radical may be supplied into the process chamber 110. The supplying of the second plasma P2 and the third plasma P3 may be interpreted in a like fashion.

Also, when the substrate or the material layer disposed on the substrate needs to be anisotropically etched, ions may be needed. In this case, ions may be generated from the radical contained in the process chamber 110 by applying a bias through the bias application unit 170. The substrate or the material layer disposed on the substrate may be anisotropically etched using the generated ions.

While the inventive concept has been particularly shown and described with reference to exemplary embodiments thereof, it will be understood that various changes in form and details may be made therein without departing from the spirit and scope of the following claims.

What is claimed is:

1. A method of fabricating a semiconductor device, the method comprising:
   placing an etching target on a stage in a process chamber;
   generating a first plasma by supplying at least one first process gas into a first plasma chamber spaced from and outside the process chamber and applying a first energy having a first power and a first frequency at a first duty ratio to the first plasma chamber;
   generating a second plasma by supplying at least one second process gas into a second plasma chamber spaced from and outside the process chamber and applying a second energy having a second power and a second frequency at a second duty ratio to the second plasma chamber;
   supplying the first plasma and the second plasma into the process chamber, wherein the first plasma and the second plasma are independently supplied into the process chamber; and
   etching the etching target using the first plasma and the second plasma,
   the first energy is applied during an on-off time period of the first energy comprising an on time period during which the first power is turned on and an off time period during which the first power is turned off, the second energy is applied during an on-off time period of the second energy comprising an on time period during which the second power is turned on and an off time period during which the second power is turned off, and the on-off time period of the first energy is equal in duration to the on-off time period of the second energy,
   the first duty ratio is equal to the second duty ratio, and the on time period of the first energy is concurrent with the off time period of the second energy,
   the first energy is applied as a continuous wave during the on time period of the first energy or the second energy is applied as a continuous wave during the on time period of the second energy.

2. The method of claim 1, wherein the supplying of the at least one first process gas into the first plasma chamber and the applying of the first energy to the first plasma chamber are performed independent of the supplying of the at least one second process gas into the second plasma chamber and the applying of the second energy to the second plasma chamber, and
   the first power is less than the second power.

3. The method of claim 1, wherein the first energy is applied during a plurality of on-off time periods of the first energy each comprising an on time period during which the first power is turned on and an off time period during which the first power is turned off, the first energy is pulsed at a first pulse frequency during at least one on time period, and the first pulse frequency is less than the first frequency of the first energy, and
   the second energy is applied during a plurality of on-off time periods of the second energy each comprising an on time period during which the second power is turned on and an off time period during which the second power is turned off, the second energy is pulsed at a second pulse frequency during at least one on time period, and the second pulse frequency is less than the second frequency of the second energy.

4. The method of claim 1, wherein a showerhead unit configured to supply the first plasma and the second plasma into the process chamber is disposed in the process chamber, the showerhead unit includes a first channel fluidly connected to the first plasma chamber and configured to supply the first plasma into the process chamber and a second channel fluidly connected to the second plasma chamber and configured to supply the second plasma into the process chamber, and the supplying of the first plasma and the supplying of the second plasma into the process chamber comprises discretely supplying the first plasma and the second plasma through the first and second channels into the process chamber without mixing the first plasma and the second plasma.

5. The method of claim 4, wherein the showerhead unit includes a first showerhead having a plurality of first holes fluidly connected to the first channel, and a second showerhead having a plurality of second holes fluidly connected to the second channel, the first holes are configured to allow at least one first type of element used to process the etching target, from among a plurality of types of elements contained in the first plasma, to pass therethrough, and the second holes are configured to allow at least one second type of element used to process the etching target, from among a plurality of types of elements contained in the second plasma, to pass therethrough.

6. The method of claim 4, wherein the discretely supplying of the first plasma and the second plasma through the first and second channels comprises sequentially, simultaneously, or alternately supplying the first plasma and the second plasma into the process chamber.

7. The method of claim 4, wherein the generating of the first plasma comprises controlling types and amounts of elements contained in the first plasma by controlling at least one of the at least one first process gas, the first power, the first frequency, and the first duty ratio, the generating of the second plasma comprises controlling types and amounts of elements contained in the second plasma by controlling at least one of the at least one second process gas, the second power, the second frequency, and the second duty ratio, and the supplying of the first plasma and the second plasma into the process chamber comprises supplying at least one first type of element used to process the etching target, from among a plurality of types of elements contained in the first plasma, through the first channel and supplying at least one second type of element used to process the etching target, from among a plurality of types of elements contained in the second plasma, through the second channel.

8. The method of claim 1, further comprising generating ions from the first plasma and the second plasma by applying a bias voltage to the process chamber.

9. The method of claim 1, wherein the etching target comprises a substrate or substrate structure including a material layer formed on the substrate or the substrate structure.

10. The method of claim 3, wherein the first pulse frequency is greater than a first on-off time frequency which has an inverse relationship with the on-off time period of the first energy, and the second pulse frequency is greater than a second on-off time frequency which has an inverse relationship with the on-off time period of the second energy.

11. The method of claim 1, wherein the first energy is pulsed at a first pulse frequency during the on time period of the first energy, and the first pulse frequency is less than the first frequency of the first energy.

12. The method of claim 1, wherein the second energy is pulsed at a second pulse frequency during the on time period of the second energy, and the second pulse frequency is less than the second frequency of the second energy.

13. The method of claim 12, wherein the second pulse frequency is greater than a second on-off time frequency which has an inverse relationship with the on-off time period of the second energy.

14. A method of fabricating a semiconductor device, the method comprising:

placing an etching target on a stage in a process chamber;

generating a first plasma by supplying at least one first process gas into a first plasma chamber spaced from and outside the process chamber and applying a first energy having a first power and a first frequency at a first duty ratio to the first plasma chamber;

generating a second plasma by supplying at least one second process gas into a second plasma chamber spaced from and outside the process chamber and applying a second energy having a second power and a second frequency at a second duty ratio to the second plasma chamber;

supplying the first plasma and the second plasma into the process chamber, wherein the first plasma and the second plasma are independently supplied into the process chamber; and etching the etching target using the first plasma and the second plasma, the first energy is applied during an on-off time period of the first energy comprising an on time period during which the first power is turned on and an off time period during which the first power is turned off, the second energy is applied during an on-off time period of the second energy comprising an on time period during which the second power is turned on and an off time period during which the second power is turned off, and the on-off time period of the first energy is equal in duration to the on-off time period of the second energy, the first duty ratio is equal to the second duty ratio, and the on time period of the first energy partially overlaps the on time period of the second energy, the first energy is applied as a continuous wave during the on time period of the first energy or the second energy is applied as a continuous wave during the on time period of the second energy.

15. The method of claim 14, wherein the first energy is applied during a plurality of on-off time periods of the first energy each comprising an on time period during which the first power is turned on and an off time period during which the first power is turned off, the first energy is pulsed at a first pulse frequency during at least one on time period, and the first pulse frequency is less than the first frequency of the first energy, and the second energy is applied during a plurality of on-off time periods of the second energy each comprising an on time period during which the second power is turned on and an off time period during which the second power is turned off, the second energy is pulsed at a second pulse frequency during at least one on time period, and the second pulse frequency is less than the second frequency of the second energy.

16. The method of claim 15, wherein the first pulse frequency is greater than a first on-off time frequency which has an inverse relationship with the on-off time period of the first energy, and the second pulse frequency is greater than a second on-off time frequency which has an inverse relationship with the on-off time period of the second energy.

17. The method of claim 14, wherein a showerhead unit configured to supply the first plasma and the second plasma into the process chamber is disposed in the process chamber, the showerhead unit includes a first channel fluidly connected to the first plasma chamber and configured to supply the first plasma into the process chamber and a second channel fluidly connected to the second plasma chamber and configured to supply the second plasma into the process chamber, and the supplying of the first plasma and the supplying of the second plasma into the process chamber comprises discretely supplying the first plasma and the second plasma through the first and second channels into the process chamber without mixing the first plasma and the second plasma.

18. The method of claim 17, wherein the at least one first process gas supplied into the first plasma chamber is a fluorine-based gas, the at least one second process gas supplied into the second plasma chamber is an oxide-based gas, and the supplying of the first plasma and the second plasma into the process chamber comprises supplying a fluorine radical into the process chamber through the first channel and supplying a nitric oxide (NO) radical into the process chamber through the second channel.

19. The method of claim 18, wherein the etching target comprises a substrate or substrate structure including a material layer formed on the substrate or the substrate structure, and the etching target is isotropically etched by controlling an inner temperature and pressure of the process chamber and amounts of the fluorine radical and the NO radical.

* * * * *